(12) United States Patent
Nakata

(10) Patent No.: US 9,608,149 B2
(45) Date of Patent: Mar. 28, 2017

(54) SOLAR CELL MODULE AND METHOD FOR PRODUCING THE SAME

(75) Inventor: Josuke Nakata, Kyoto (JP)

(73) Assignee: SPHELAR POWER CORPORATION, Kyoto (JP)

( * ) Notice: Subject to any disclaimer, the term of this patent is extended or adjusted under 35 U.S.C. 154(b) by 1280 days.

(21) Appl. No.: 12/998,898

(22) PCT Filed: Dec. 19, 2008

(86) PCT No.: PCT/JP2008/003870
§ 371 (c)(1),
(2), (4) Date: Jun. 14, 2011

(87) PCT Pub. No.: WO2010/070714
PCT Pub. Date: Jun. 24, 2010

(65) Prior Publication Data
US 2012/0222724 A1    Sep. 6, 2012

(51) Int. Cl.
*H01L 31/05*      (2014.01)
*H01L 31/0352*    (2006.01)
*H01L 31/02*      (2006.01)
*H01L 31/048*     (2014.01)

(52) U.S. Cl.
CPC ........ *H01L 31/03529* (2013.01); *H01L 31/02* (2013.01); *H01L 31/035281* (2013.01); *H01L 31/0488* (2013.01); *H01L 31/0508* (2013.01); *Y02E 10/50* (2013.01)

(58) Field of Classification Search
None
See application file for complete search history.

(56) References Cited

U.S. PATENT DOCUMENTS

| 7,205,626 B1 | 4/2007 | Nakata |
| 7,238,968 B2 | 7/2007 | Nakata |
| 7,244,998 B2 | 7/2007 | Nakata |
| 7,602,035 B2 | 10/2009 | Nakata |

(Continued)

FOREIGN PATENT DOCUMENTS

| WO | WO-98/15983 | 4/1998 |
| WO | WO-02/35613 | 5/2002 |

(Continued)

*Primary Examiner* — Magali P Slawski
(74) *Attorney, Agent, or Firm* — Norris McLaughlin & Marcus, P.A.

(57) ABSTRACT

This solar cell module (1) comprises a plurality of solar cell arrays (11). Each solar cell array (11) includes a plurality of spherical semiconductor elements (20) arranged in a row, at least a pair of bypass diodes (40), and a pair of lead members (14) that connect the plurality of spherical semiconductor elements (20) and the plurality of bypass diodes (40) in parallel. Each of the lead members (14) includes one or plural lead strings (15) to which the plurality of spherical semiconductor elements (20) are electrically connected and having a width less than or equal to the radius of the spherical semiconductor element (20), and plural lead pieces (16) formed integrally with the lead strings (15) at least at both end portions of the lead member (14), on which the bypass diodes (40) are electrically connected in reverse parallel to the spherical semiconductor elements (20), and having width larger than or equal to the width of the bypass diodes (40).

6 Claims, 25 Drawing Sheets

(56) References Cited

U.S. PATENT DOCUMENTS

| | | | |
|---|---|---|---|
| 2001/0027805 A1* | 10/2001 | Ho et al. | 136/256 |
| 2003/0000565 A1* | 1/2003 | Hayashi et al. | 136/244 |
| 2004/0238833 A1 | 12/2004 | Nakata | |
| 2005/0067622 A1 | 3/2005 | Nakata | |
| 2005/0127379 A1 | 6/2005 | Nakata | |
| 2006/0054210 A1* | 3/2006 | Proisy et al. | 136/244 |
| 2006/0086384 A1* | 4/2006 | Nakata | 136/250 |
| 2006/0169992 A1* | 8/2006 | Nakata | 257/82 |
| 2008/0289688 A1* | 11/2008 | Hammerbacher et al. | 136/256 |
| 2012/0307341 A1* | 12/2012 | Higuchi et al. | 359/275 |

FOREIGN PATENT DOCUMENTS

| | | |
|---|---|---|
| WO | WO-03/017382 | 2/2003 |
| WO | WO-03/017383 | 2/2003 |
| WO | WO-03/036731 | 5/2003 |

* cited by examiner

SOLAR CELL MODULE AND METHOD FOR PRODUCING THE SAME

TECHNICAL FIELD

The present invention relates to a solar cell module and its manufacturing method in which, by adhering a plurality of spherical solar cells to narrow lead strings of an electrically conductive connecting mechanism and by adhering a plurality of bypass diodes to wide lead pieces of that electrically conducting mechanism, these are arranged in the form of a matrix having a plurality of rows and a plurality of columns, and a transparent panel member in a pair of panel members is integrally provided at least on an incident side of sunlight.

BACKGROUND TECHNOLOGY

In the prior art, various solar cell modules have already been implemented in which solar cells are installed in a window material. For the solar cells installed in these solar cell modules, solar cells made in flat plate form from flat silicon crystal plates, or spherical solar cells made from spherical silicon crystals, or thin layer type solar cells made by forming layers on a glass substrate or the like have been employed.

Now, the inventor of the present application has proposed a spherical solar cell as disclosed in Patent Document #1. This spherical solar cell includes a p type or n type spherical silicon single crystal of diameter 1 mm to 2 mm, a pn junction formed near the outer surface of this spherical silicon single crystal and shaped as a partially spherical surface, and positive and negative electrodes in spot form that respectively make low resistance contact with center portions of the p type and n type surface regions on opposite sides of the center of the sphere. Since the positive and negative electrodes are provided at the two end portions of the solar cell, accordingly not only is this solar cell capable of receiving light directly incident from any direction without any bias, but also the efficiency of utilization of external light is remarkably enhanced over that of a solar cell which is formed as a flat plate, since this solar cell can receive light that is reflected or diffused from its surroundings.

Furthermore, the inventor of the present application has proposed a solar cell module as disclosed in Patent Document #2. With this solar cell module, for example, 25 spherical solar cells whose electrically conductive directions are all aligned are arranged as a matrix form having 5 rows and 5 columns, they are held by an electrically conductive construction made from six metallic lead frames, and the external periphery thereof is molded with transparent resin (a covering material). Solar cell modules of similar types to the above are also described in Patent Documents #3 and #4.

Now, for the spherical solar cells described above, spherical silicon single crystals of diameter 1 mm to 2 mm are employed in order to enhance the output per unit weight of the spherical silicon single crystals. Since the output of each of the spherical solar cells is low (for example approximately 0.5 mW), in order to increase the output of the module, it is necessary to increase the number of the spherical solar cells that are connected in series and the number of the spherical solar cells that are connected in parallel. However, it is difficult to connect up such a large number of small spherical solar cells, so that the manufacturing cost is high. For this reason, there is a demand for a manufacturing method for connecting up a large number of spherical solar cells simply and at low cost.

Thus, with the method for producing solar cell modules described in the above Patent Documents #2 to #4, first, five spherical solar cells, with their electrically conductive directions aligned, are connected at regular intervals on each of three lead strings that are formed as a flat plate shaped lead frame. Next, a lead frame of the same shape is mounted over this structure and is connected to it, and furthermore five spherical solar cells are connected to each of the lead strings on this lead frame. Subsequently, further lead frames and solar cells are successively mounted and connected in a similar manner to that described above, and thereby three solar cell groups are manufactured in which the solar cells are arranged in five rows, and in five columns in the direction orthogonal to the lead frames. And three solar cell modules are manufactured by resin molding these cell groups.

Since, in the solar cell modules described in the above Patent Documents #2 to #4, the plurality of spherical solar cells are connected in series and also in parallel by a connection circuit like a mesh, accordingly, even if the output current of each of the solar cells fluctuates to a certain extent, it can still be anticipated that the current distribution is equalized via the parallel connections. And even if a portion of these solar cells are in the shade so that their output current decreases, it may be anticipated that the current distribution will be equalized in a similar manner.

Patent Document #1: International Publication WO 98/15983;
Patent Document #2: International Publication WO 02/35613;
Patent Document #3: International Publication WO 03/017382;
Patent Document #4: International Publication WO 03/017383.

DISCLOSURE OF THE INVENTION

Problems to be Solved by the Invention

However while, in the solar cell modules of Patent Documents #2 to #4 described above, the construction is one in which a plurality of sub arrays including solar cells are laminated together in several stages, since the width of the lead strings is made as a fixed width that is narrower than the radius of the solar cells, accordingly manufacturing by the method of laminating together the sub arrays in several stages is impossible after the sub arrays have been assembled. The reason for this is because there are no portions on the sub arrays by which they can be grasped by the hand of an automatic assembly device, and also it is not possible to form any engagement portions that are suitable for setting the positions of the sub arrays. Due to this, it is necessary to develop a method of some special type for production, and the manufacturing cost becomes high.

And since, in the above described manufacturing method for producing a solar cell module, a plurality of assembled groups each having of a plurality of rows and a plurality of columns of solar cells are made by installing a plurality of spherical solar cells between metallic plates that are formed with a plurality of lead strings, and thereafter these are held in dies and resin molded, accordingly dies of complex structures are required, so that the manufacturing cost becomes high.

Moreover, since it is necessary to insert the dies between the plurality of assembled groups during the resin molding, accordingly it is necessary to ensure space between the assembled groups. For this reason, it is necessary for the metallic plates on which the plurality of lead strings are formed to be large sized metallic plates, and the manufacturing cost becomes high, because a great deal of scrap is created by punching out slots from the metallic plates.

Thus, objects of the present invention are to provide a solar cell module that can be assembled efficiently, and its manufacturing method for producing it, and also to provide a solar cell module that is advantageous from the point of view of resin sealing.

Means to Solve the Problem

The present invention presents a solar cell module comprising a plurality of spherical semiconductor elements arranged in a matrix form having a plurality of rows and a plurality of columns and having a function of photoelectric conversion respectively, in which plural spherical semiconductor elements in each row are arranged to be a solar cell array so that their electrically conductive directions are aligned along the column direction of the matrix form and electrically connected in parallel via lead members, characterized in that: the spherical semiconductor elements comprises a p type or an n type spherical semiconductor, and a pn junction like a partially spherical surface formed on an outer layer portion of the spherical semiconductor; the solar cell array comprises plural spherical semiconductor elements, at least a pair of bypass diodes, and a pair of lead members that electrically connect the plural spherical semiconductor elements and plural bypass diodes in parallel; and the lead member comprises one or plural lead strings, having a width less than or equal to the radius of the spherical semiconductor element, to which the plural spherical semiconductor elements are electrically connected, and plural lead pieces, having a width larger than or equal to the width of the bypass diodes, formed integrally with the lead strings at least at both end portions of the lead member, to which the bypass diodes are electrically connected in inverse parallel with the spherical semiconductor elements.

Further, the present invention presents a manufacturing method for manufacturing a solar cell module comprising a plurality of spherical semiconductor elements arranged in a matrix form having a plurality of rows and a plurality of columns and having a function of photoelectric conversion respectively, in which spherical semiconductor elements in each row arranged to be a solar cell array so that their electrically conductive directions are aligned with the column direction of the matrix form and electrically connected in parallel via lead members, characterized by comprising: a first process of preparing in advance a plurality of spherical semiconductor elements, each having a p type or n type spherical semiconductor and a pn junction like partially spherical surface on an outer layer portion of the spherical semiconductor, and of also preparing in advance plural spherical bypass diodes of similar size to that of the spherical semiconductor elements; a second process of forming a plurality of openings in slit form in plural rows and plural columns in a thin metallic sheet, and forming band portions that are continuous along a column direction at both end portions in a row direction and between columns of the openings, and thereby forming a plurality of lead strings each having a width less than or equal to a radius of the spherical semiconductor element between the plural openings; a third process of applying a first conductive connection material in the semi solid state on each of the plurality of lead strings in the form of a plurality of spots in order to electrically connect the plurality of spherical semiconductor elements, and of also applying a second conductive connection material in the semi solid state at sites on the band portions corresponding to the plurality of lead strings in form of plural spots in order to electrically connect the plural bypass diodes; a fourth process of connecting the positive electrodes or negative electrodes of the plurality of spherical semiconductor elements to the plurality of spots of first conductive connection material, and also connecting cathodes or anodes of the plural bypass diodes to the plurality of spots of second conductive connection material; a fifth process of applying the first conductive connection material in form of spots to summit portions of the plurality of spherical semiconductor elements on the plurality of lead strings, and of also applying the second conductive connection material in form of spots to summit portions of the plural bypass diodes on the plural band portions; a sixth process of applying heat to the thin metallic sheet with the plurality of spherical semiconductor elements and the plural bypass diodes disposed thereon, and hardening the spots of first and second conductive connection material, thus forming first and second electrically conductive connection portions; a seventh process of, by making lead pieces by dividing the band portions of the thin metallic sheet into sections at positions corresponding to intermediate points between lead strings adjacent each other, manufacturing a plurality of solar cell sub arrays each including a plurality of spherical semiconductor elements, plural bypass diodes, and a single lead member; an eighth process of applying conductive adhesive material to first electrically conductive connection portions at summit portions of the pluralities of spherical semiconductor elements, and to second electrically conductive connection portions at summit portions of the pluralities of bypass diodes, in the solar cell sub arrays; a ninth process of sequentially laminating together the plurality of solar cell sub arrays and thus assembling the plurality of spherical semiconductor elements and the plurality of bypass diodes into a cell assembly in matrix form having a plurality of rows and a plurality of columns, while guiding the pair of lead pieces at the both ends of the solar cell sub arrays with a pair of guide members of a predetermined assembly jig; and a tenth process of hardening the conductive adhesive material by performing heating processing on the cell assembly in matrix form.

Advantages of the Invention

According to the solar cell module of the present invention, the lead member comprises one or plural lead strings to which a plurality of spherical semiconductor elements are electrically connected and the lead string has a width less than or equal to the radius of the spherical semiconductor element, and the plurality of lead pieces are formed integrally with the lead strings at least at both end portions of the lead member, and bypass diodes are electrically connected to lead pieces, and the lead piece has a width larger than or equal to the width of the bypass diode.

Therefore, solar cell sub arrays can be manufactured in each of which a plurality of spherical semiconductor elements and plural bypass diodes are attached to a single lead member that includes the lead string or strings and the lead pieces, and, when a plurality of these sub arrays are to be laminated together into a multi layer structure solar cell arrays, it is possible for the lead pieces to be grasped by the hand of an automatic assembly device. Furthermore, since it is also possible to form any desired type of engagement portions for positional determination on the lead pieces for determining the positions of the sub arrays while they are being laminated, accordingly the solar cell module can be assembled in an efficient manner with an automatic assembly device.

Moreover, since the pair of panel members are provided to the solar cell module, and since it is possible to set the gap between the pair of panel members by sandwiching the plurality of lead pieces between the pair of panel members when the module main body portion (a plurality of solar cell arrays) of the solar cell module is to be sandwiched between these panel members and sealed with resin, accordingly an advantage is obtained during the resin sealing process.

Moreover since, according to the manufacturing method for manufacturing a solar cell module according to the present invention, a plurality of solar cell sub arrays are manufactured, and these are sequentially laminated together and assembled into a cell assembly in matrix form like a panel, accordingly it becomes possible to sandwich the cell assembly in matrix form between the panel members and to seal them with resin. Due to this, it becomes possible to resin seal this cell assembly between the pair of panel members without using any die of a complicated construction. For this reason, it is possible to reduce the manufacturing cost of the solar cell module, and it also becomes possible to increase the size of the solar cell module.

Moreover, since the lead pieces at both ends of the lead string are formed integrally therewith, accordingly it is possible to grasp the lead pieces with the hands of an automatic assembly device when, after having manufactured a plurality of the solar cell sub arrays, these are being laminated together and assembled; and, since it is possible to perform positioning of the sub arrays using the lead pieces, accordingly it is possible to assemble the solar cell module efficiently and with good accuracy. And, when resin sealing the solar cell assembly, it is possible to set the gap between the pair of panel members by sandwiching the plurality of lead pieces between the pair of panel members.

In addition to the constitution of the present invention as described above, it would also be acceptable to arrange to employ the following various constitutions.

(1) The spherical semiconductor elements may be electrically connected to lead strings via a pair of first conductive connection portions that are formed as dots at both end portions of the spherical semiconductor elements on an axial line through the center of the spherical semiconductor element and parallel to the column direction, and that are electrically connected to both ends of the pn junction with low resistance.

(2) The bypass diodes may be electrically connected to lead pieces via a pair of second conductive connection portions that are formed at both end portions of bypass diodes on an axial line through the center of the bypass diode and parallel to the column direction, and that are electrically connected to both ends of the pn junction of the bypass diodes with low resistance.

(3) The directions of electrical conductivity of all of the plurality of spherical semiconductor elements in the plurality of rows may all be aligned in the same direction; solar cell arrays adjacent in the column direction may share the lead member positioned between those solar cell arrays; and the plurality of spherical semiconductor elements in each column and the plural bypass diodes along column direction may be connected in series via the plurality of lead members.

(4) The directions of electrical conductivity of all of the plurality of spherical semiconductor elements in the plurality of rows may all be aligned in the same direction; one or plural spacers made from an insulating material may be provided between solar cell arrays adjacent in the column direction; and an external lead may be formed integrally with at least one end portion of the lead member.

(5) The plurality of solar cell arrays may be made in a form of a flat plate; and a pair of parallel panel members may be provided so as to close both sides of the plurality of solar cell arrays; transparent synthetic resin may be charged between the pair of panel members so as to seal the plurality of spherical semiconductor elements and the plurality of lead members; and at least the panel member on an incident side of sunlight may be made from a transparent material.

(6) The plurality of solar cell arrays may be made in the shape of a plurality of partially cylindrical surfaces connected at one or plural inflexion points dividing equally the plurality of rows of the matrix form, or in a shape of a single partially cylindrical surface; and there are provided a first curved panel member, made from a transparent material, that closes the surface of the plurality of solar cell arrays on an incident side of sunlight, and has a shape of one or plural partially cylindrical surfaces, a second curved panel member that closes the surface of the plurality of solar cell arrays on an opposite side to the incident side of sunlight, and has a shape of one or plural partially cylindrical surfaces, and transparent synthetic resin charged between the first and second curved panel members for sealing the plurality of spherical semiconductor element and the plurality of lead members.

(7) One or plural intermediate lead pieces similar to the lead pieces may be formed integrally with one or plural intermediate portions of the lead members in the row direction of the matrix form, and one or plural bypass diodes may be provided corresponding to the one or plural intermediate lead pieces in each row.

(8) It may be arranged for a gap between the pair of panel members to be set by the plurality of lead pieces being sandwiched between the pair of panel members.

(9) It may be arranged for a gap between the first and second curved panel members to be set by the plurality of lead pieces being sandwiched between the first and second curved panel members.

(10) Engagement portions for engaging with external guide members during assembly of the solar cell module may be formed at the outer end portions of the lead pieces.

(11) A reflective layer or a printed layer that has been ornamented may be formed on an inner surface or on an outer surface of the panel member, among the pair of panel members, that is on a side opposite to the incident side of sunlight.

(12) After the tenth process, there may be provided with an eleventh process of, along with arranging the cell assembly in matrix form between a pair of panel members at least one of which is transparent, charging transparent synthetic resin between the pair of panel members, and then performing heat application processing.

(13) In the second process, along with forming openings in circular arc shapes as the openings in slit form, the lead strings for each column may be formed in circular arc shapes.

(14) After the tenth process, there may be provided with an eleventh process of, along with arranging the cell assembly in matrix form between first and second curved panel members at least one of which is transparent, charging transparent synthetic resin between the first and second curved panel members, and then performing heat application processing.

Figure 1:
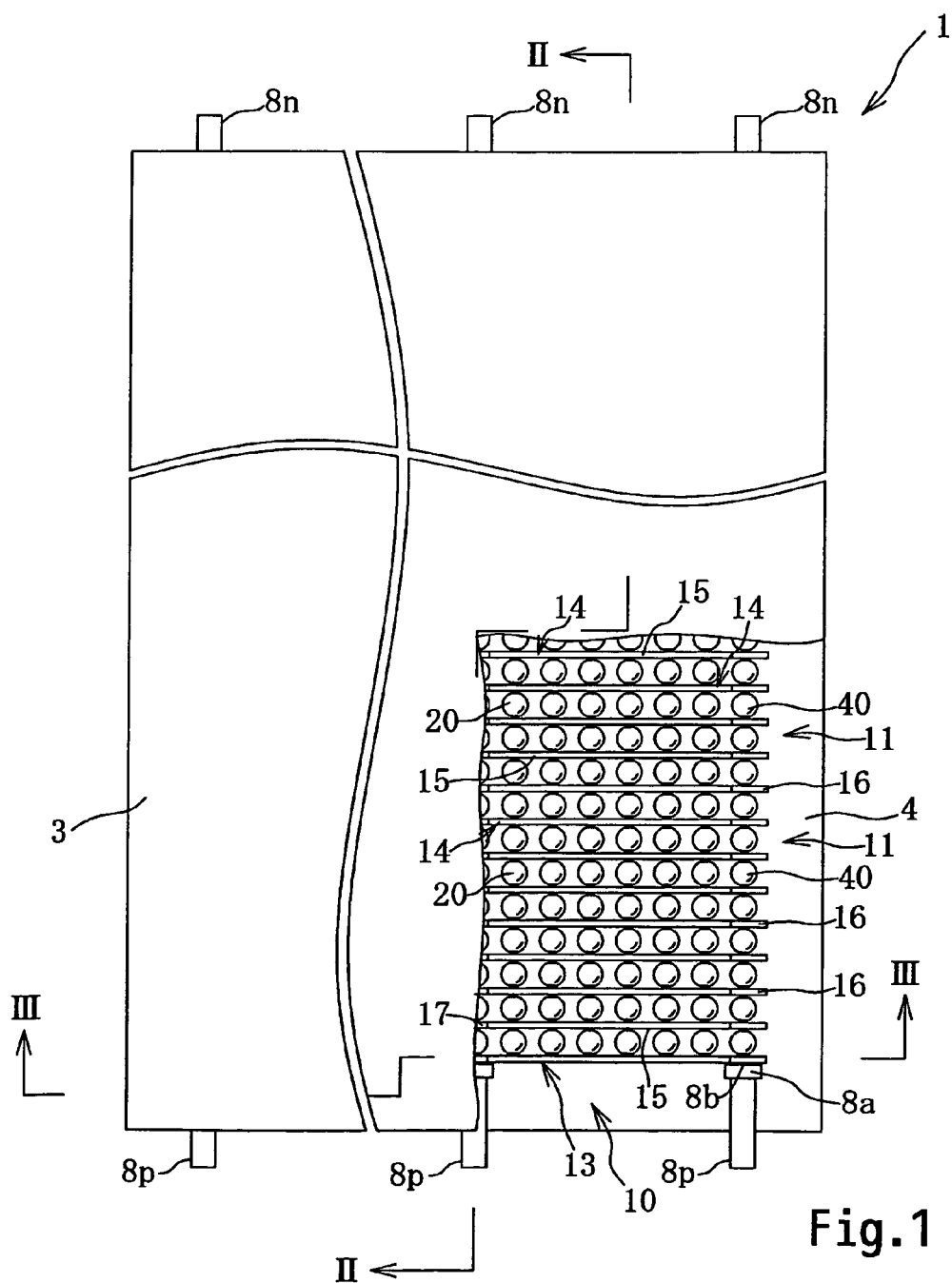
FIG. 1 is an elevation view of a solar cell module according to a first embodiment of the present invention.

DESCRIPTION OF NUMERALS 1, 1A, 1B: solar cell modules
3, 4: panel members
6, 66: transparent synthetic resin
10, 10A, 10B, 10C: solar cell assembly
11, 11A, 11B, 11C: solar cell arrays
12, 12A: solar cell sub arrays
13, 13A, 13B: electrically conductive connecting mechanisms
14, 14B: lead members
15: lead string
16: lead piece
17: intermediate lead piece
20: spherical solar cell
21: p type spherical semiconductor
31: positive electrode
32: negative electrode
40: bypass diode
41: n type spherical semiconductor
47: anode
48: cathode
50, 50A: thin metallic sheets
63, 64: curved panel members

BEST MODE FOR IMPLEMENTING THE INVENTION

In the following, a best mode for implementing the present invention will be explained on the basis of embodiments.

Embodiment 1

First, the constitution of a solar cell module 1 will be explained.

Figure 2:
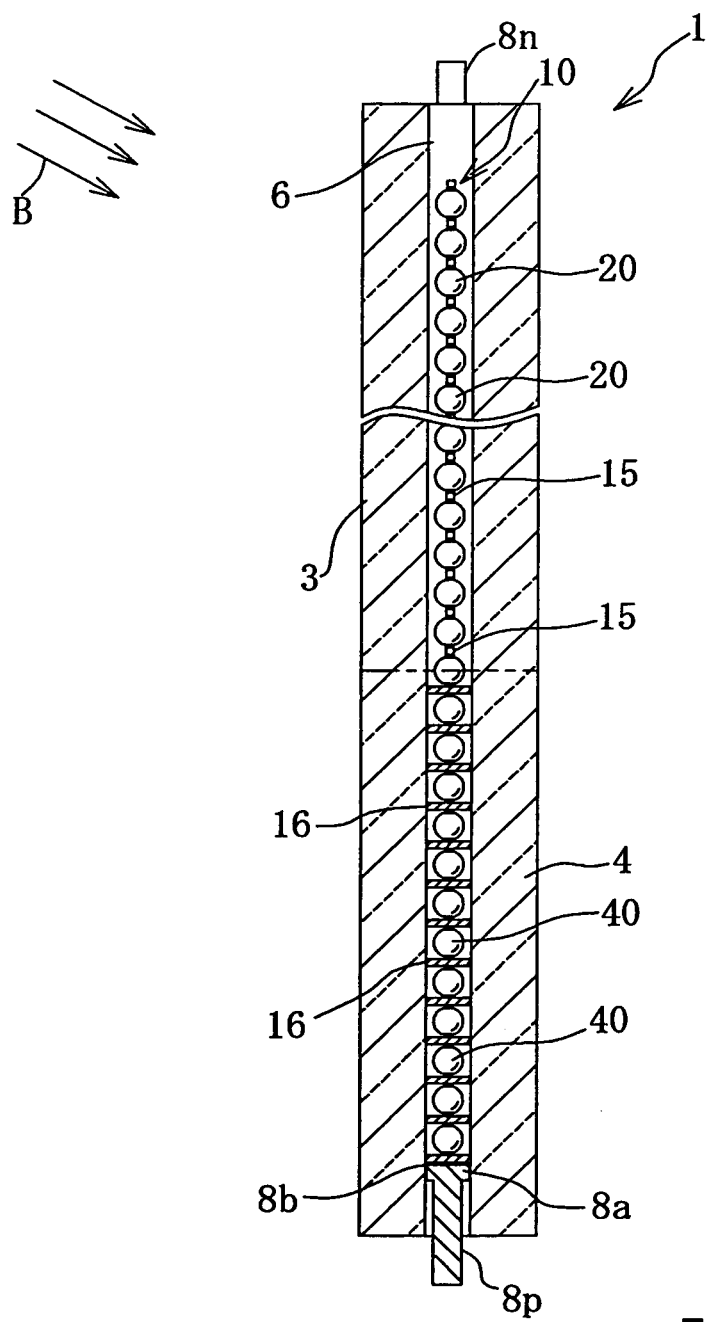
FIG. 2 is a sectional view taken along lines II II of FIG. 1.
Figure 3:
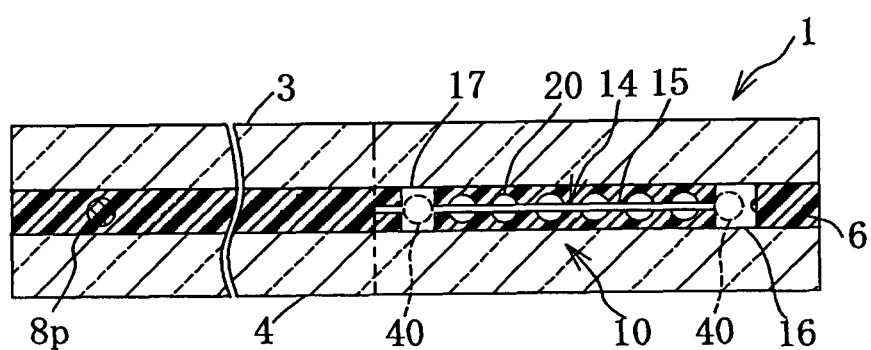
FIG. 3 is a sectional view taken along lines III III of FIG. 1.
Figure 4:
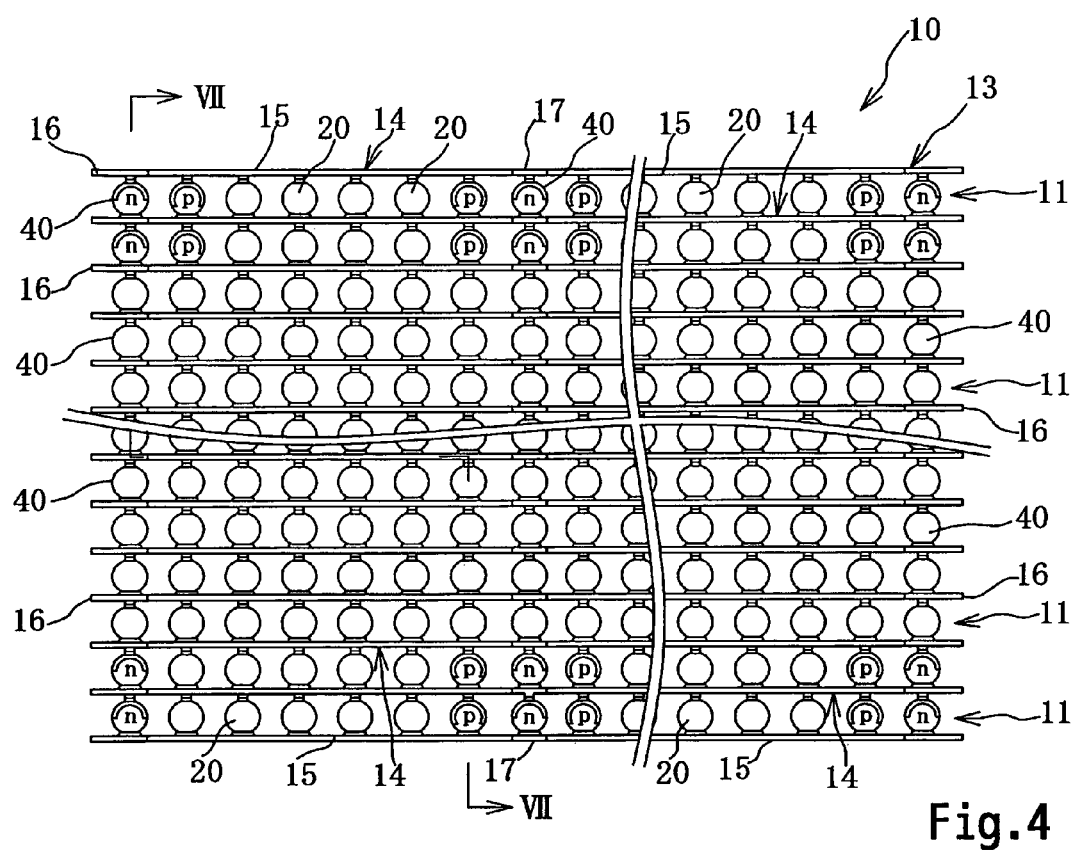
FIG. 4 is an elevation view of a solar cell assembly.
Figure 5:
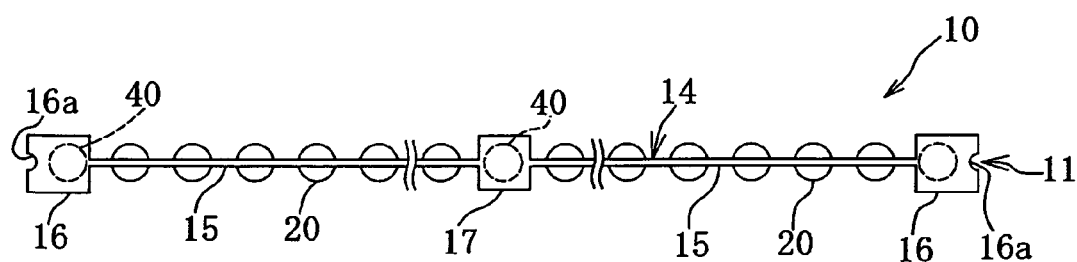
FIG. 5 is a plan view of the solar cell assembly.
Figure 6:
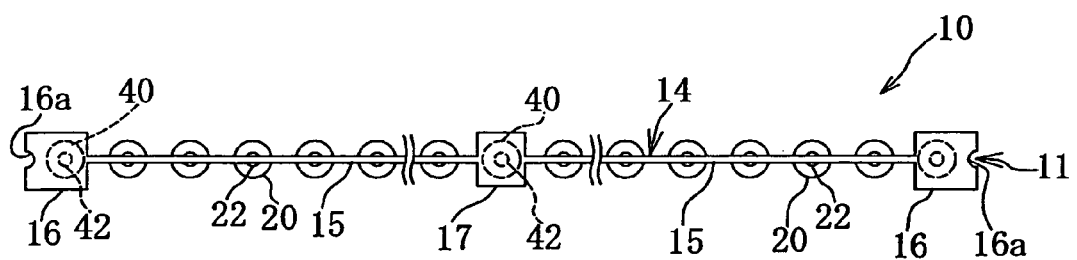
FIG. 6 is a bottom view of the solar cell assembly.
Figure 7:
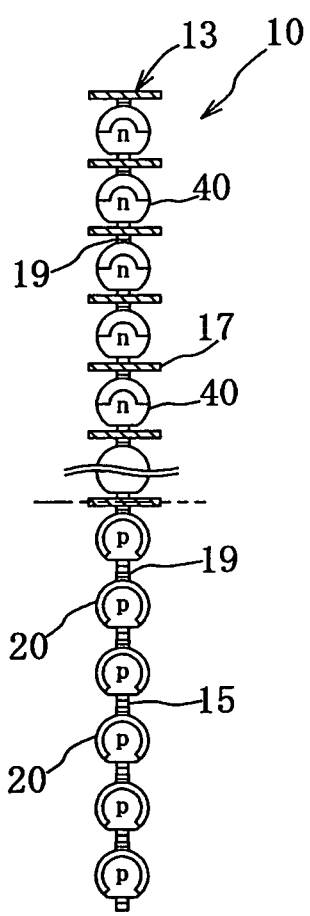
FIG. 7 is a sectional view taken along lines VII VII of FIG. 4.

As shown in FIGS. 1 to 3, this solar cell module 1 is a module in the form of a rectangular panel that, for example, is disposed in a vertical attitude. The solar cell module 1 comprises a pair of panel members 3, 4 that are formed as flat transparent plates, a solar cell assembly 10 made from a plurality of solar cell arrays 11 that are sandwiched between the panel members 3, 4, transparent synthetic resin 6 that is charged between the panel members 3, 4, and a plurality of external leads 8p, 8n for outputting the electric output of the plurality of spherical solar cells 20 to the exterior. With this solar cell module 1, the external leads 8p at the lower side are the positive electrodes and the external leads 8n at the upper side are the negative electrodes. It should be noted that up, down, left and right in FIG. 1 are explained as being up, down, left and right, and it is supposed that the front side of the drawing paper is the incident side of sunlight.

The panel members 3, 4 are provided in parallel for protecting both sides of the plurality of solar cell arrays 11. The panel members 3, 4, for example, may be made from any material selected from transparent glass, transparent polycarbonate, acrylic, silicon resin, or the like. The gap between the panel members 3, 4 is set by a plurality of lead pieces 16 and a plurality of intermediate lead pieces 17 that will be described later, which are sandwiched and held between the panel members 3, 4. Among panel members 3, 4, at least the panel member on the incident side of sunlight should be made from a transparent material.

Figure 17:
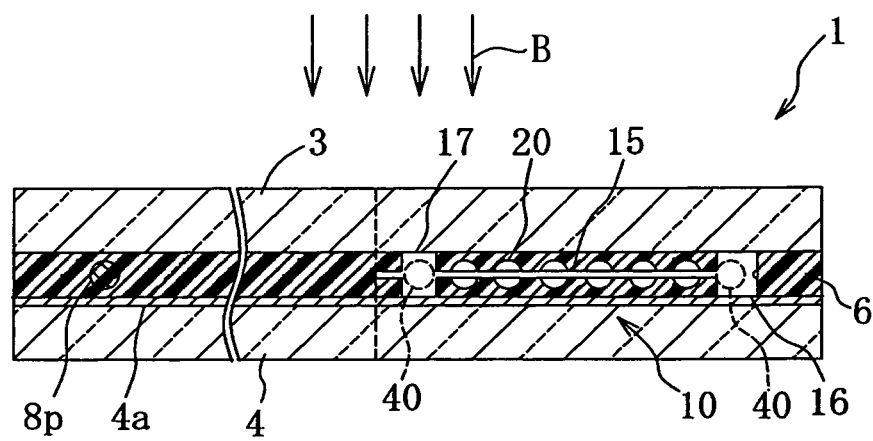
FIG. 17 is a sectional view of a partially modified embodiment of the solar cell module.
Figure 18:
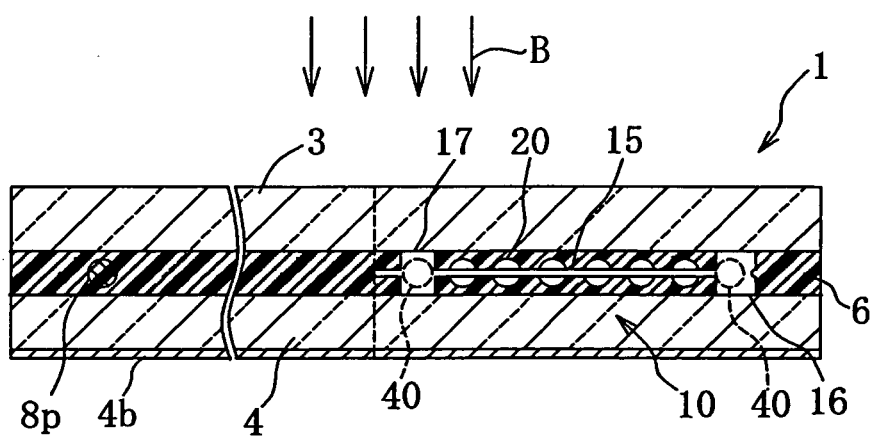
FIG. 18 is a sectional view of a partially modified embodiment of the solar cell module.

The transparent synthetic resin 6 that seals the solar cell assembly 10 is charged between the panel members 3, 4. A material such as, for example, EVA resin or silicon resin or the like is used as this transparent synthetic resin 6. As shown in FIGS. 17, 18, for the panel members 3, 4, it would also be acceptable to provide a reflective layer 4a or a printed layer 4a that is made to be ornamental on the inner surface of the panel member 4 on the opposite side to the incident side of sunlight; or it would also be acceptable to provide a reflective layer 4b or a printed layer 4b that is made to be ornamental on the outer surface of the panel member 4.

As shown in FIG. 1, the end portions 8a of the plurality of external leads 8p at the lower end portion of the solar cell module 1 are each adhered by an electrically conducting junction member 8b to the lower surface of a lead piece 16 or of an intermediate lead piece 17 of a lead member 14 at the lowermost edge of the cell assembly 10. Due to this, the external leads 8p at the lower edge portion are electrically connected to the lead member 14 at the lowermost edge of the cell assembly 10.

And the end portions 8a of the plurality of external leads 8n at the upper end portion of the solar cell module 1 are each adhered by an electrically conducting junction member 8b to the upper surface of a lead piece 16 or of an intermediate lead piece 17 of a lead member 14 at the uppermost edge of the cell assembly 10. Due to this, the external leads 8n at the upper edge portion are electrically connected to the lead member 14 at the uppermost edge of the cell assembly 10.

When manufacturing a large sized solar cell panel (module), a constitution is adopted in which a plurality of modules similar to the above module 1 are arranged in a plurality of rows and a plurality of columns, the modules 1 that are vertically adjacent are electrically connected in series together by connecting their external leads 8p, 8n, these plurality of modules is attached to an external peripheral frame made from aluminum, and electrical power is taken out from output terminals on this external peripheral frame.

Next, the solar cell assembly 10 will be explained. As shown in FIGS. 4 to 8, the solar cell assembly 10 comprises: a plurality of spherical solar cells 20 (corresponding to the "spherical semiconductor elements") that are endowed with the function of photoelectric conversion respectively, and that are arranged in the matrix form having a plurality of rows and a plurality of columns, with their directions of electrical conductivity being aligned along the column direction of the matrix; plural bypass diodes 40 whose directions of electrical conductivity are arranged along the column direction of the matrix and that are connected in inverse parallel with the spherical solar cells 20; and an electrically conductive connecting mechanism 13 in which the plural spherical solar cells 20 and the plural bypass diodes 40 in each row are connected in parallel, while the plurality of spherical solar cells 20 in each column and the plurality of bypass diodes 40 for each column are connected in series respectively. The cell assembly 10, which is built up from the plurality of solar cell arrays 11, is made in the form of a flat plate. It should be understood that the plurality of spherical solar cells 20 and the plurality of bypass diodes 40 are arranged in the matrix form having a plurality of rows and a plurality of columns.

The plurality of solar cell arrays 11 make up the solar cell assembly 10, and each solar cell array 11 comprises a plurality of spherical solar cells 20 for that row, plural bypass diodes 40 for that row, and a pair of lead members 14, 14 that connect the plurality of spherical solar cells 20 and the plural bypass diodes 40 in parallel. The electrically conductive directions of all of the pluralities of spherical solar cells 20 for the plurality of rows are all aligned in the same direction (i.e. column direction). Solar cell arrays 11 that are adjacent in the column direction of the matrix form share the lead members 14 that are positioned between those solar cell arrays 11. The pluralities of spherical solar cells 20 for each column and the pluralities of bypass diodes 40 for each column are connected in series via the plurality of lead members 14. At least a pair of bypass diodes 40 are included in each solar cell array 11.

Next, the electrically conductive connecting mechanism 13 will be explained. As shown in FIGS. 4 to 7, the electrically conductive connecting mechanism 13 includes a plurality of rectilinear lead members 14 that are disposed at a plurality of positions between rows of the matrix and at both end positions of the matrix in its column direction. Each of these lead members 14 includes a pair of lead pieces 16 that are formed at both ends of the lead member 14 and one or plural intermediate lead pieces 17 that are formed at intermediate portions thereof, with the plural lead pieces 16, 17 having of a width larger than or equal to the diameter (i.e. the width) of the bypass diode 40 respectively, and also includes plural lead strings 15 that are formed between these lead pieces 16, 17 and having a width less than or equal to the radius of the solar cell 20 respectively.

One or plural intermediate lead pieces 17 are provided at intermediate portions of the lead member 4 along the row direction of the matrix. The lead pieces 16 and the intermediate lead pieces 17 are disposed orthogonally to the column direction of the matrix, and their width in the direction orthogonal to the row direction of the matrix is preferably larger than the diameter of the bypass diode 40. The lead members 14 are made from metallic plate of, for example, iron nickel alloy (56% Fe, 42% Ni) having thickness of 0.3 mm. The surfaces of the lead members 14 are plated with silver or nickel. And the width of the lead strings is, for example, 0.5 mm to 0.7 mm. The width of the lead pieces 16 and of the intermediate lead pieces 17 may be, for example, 2.6 mm to 3.0 mm.

Except for the lead member 14 at the uppermost edge of the cell assembly 10, the positive electrodes 31 of the plurality of solar cells 20 are adhered to the upper surface of each of the lead strings 15. And, except for the lead member 14 at the lowermost edge of the cell assembly 10, the negative electrodes 32 of the plurality of solar cells 20 are adhered to the lower surface of each of the lead strings 15 with electrically conductive adhesive material 19 (refer to FIG. 9). Thus, this electrically conductive connecting mechanism 13 is made as a circuit connected in the form of a mesh, in which the solar cells 20 are connected in series and also in parallel.

Moreover, except for the lead member 14 at the uppermost edge of the cell assembly 10, the cathodes 48 of plural bypass diodes 40 are adhered to the upper surfaces of the lead pieces 16 and of the intermediate lead pieces 17. And, except for the lead member 14 at the lowermost edge of the cell group 10, the anodes 47 of the plurality of bypass diodes 40 are adhered to the upper surfaces of the lead pieces 16 and of the intermediate lead pieces 17 with electrically conductive adhesive material 19 (refer to FIG. 10).

The plurality of lead pieces 16 and the plurality of intermediate lead pieces 17 of the cell assembly 10 described above are oriented in the direction orthogonal to the panel members 3, 4, and, since they are sandwiched and held between the panel members 3, 4, accordingly the gap between the panel members 3, 4 is set by the plurality of lead pieces 16 and the plurality of intermediate lead pieces 17. Engagement portions 16a consisting of semicircular notches are formed at the outer edge portions of the lead pieces 16, for engaging with and being guided by guide members of an automatic assembly device while the solar cell sub arrays 12 are being laminated together in a plurality of layers during assembly of the solar cell module 1, as will be described hereinafter.

Figure 9:
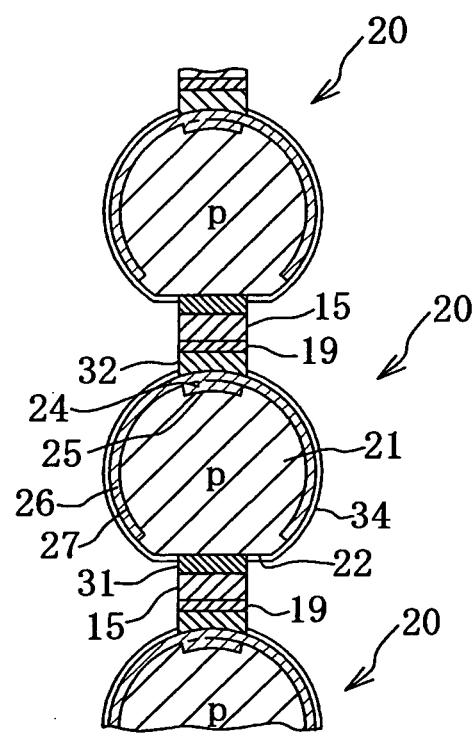
FIG. 9 is an enlarged sectional view of a plurality of spherical solar cells and of the essential portions of a plurality of lead members.

Next, the construction of the spherical solar cells 20 will be explained. As shown in FIG. 9, one solar cell 20 comprises: a spherical semiconductor 21 made from a p type semiconductor (a single silicon crystal); a flat surface 22 made by grinding a portion of the surface of the spherical semiconductor 21; a pn$^+$ junction 25 in the form of a spot, made by forming an n$^+$ diffused layer 24 as a spot on a portion of the outer layer of the spherical semiconductor 21 that is on the opposite side of the center of the spherical semiconductor 21 from the flat surface 22; a pn junction 27 in the form of a partially spherical surface, made by forming an n type diffusion layer 26 on a portion of the outer layer of the spherical semiconductor 21; a pair of positive and negative electrodes 31, 32 (corresponding to the "first conductive connection portions") attached to the pn$^+$ junction 25 and to the pn junction 27 formed on parts of the outer layer of the spherical conductor 21 on opposite sides relative to its center, i.e. at its both ends; and a reflection prevention layer 34 that is formed over all portions except the positive and negative electrodes 31, 32. The positive electrode 31 is electrically connected with low resistance to the central portion of the flat surface 22 of the spherical semiconductor 21, and the negative electrode 32 is electrically connected with low resistance to the surface of the n type diffusion layer 26.

Since the positive and negative electrodes 31 and 32 are located in symmetrical positions on opposite sides of the center of the spherical semiconductor 21, and are made in the form of small spots, accordingly it is possible for this spherical solar cell 20 to receive directly incident light that arrives at the surface of the spherical semiconductor 21, as well as reflected light and diffused light, and accordingly its light utilization efficiency is high. And, since it is possible to connect the spherical solar cells 20 together with the lead members and the other electrically conductive members as a three dimensional solid body, accordingly it is possible to provide a solar cell module 1 whose freedom of design and design quality are outstanding.

Next, a method for producing these spherical solar cells 20 will be explained simply. First, a p type spherical silicon single crystal 21 is prepared. For manufacturing this silicon single crystal 21, for example, after silicon including a p type impurity has been melted in an upper melting pot, drops of this molten silicon are allowed to fall freely. After these drops have been formed into spherical shapes by surface tension while falling, they are cooled and solidified, so that they become spherical crystals. The various conditions are set so that the diameter of these spherical crystals becomes around 1.6 mm, and, since quite often small projections are formed on their surfaces, accordingly finishing processing is performed so as to eliminate these projections, thus producing spherical shapes of high dimensional accuracy, for example of diameter around 1.5 mm.

Next, a portion of this spherical silicon crystal 21 is processed by grinding, so that the flat surface 22 of diameter 0.7 mm to 0.9 mm is provided. This flat surface 22, along with preventing rolling of the spherical crystal during subsequent manufacturing processing, is also used for positioning when forming electrodes on it and connecting them with external conductors, and so on. Next, heat is applied to the p type silicon single crystal 21 in an atmosphere containing oxygen, so that its entire surface is covered with a silicon oxide layer and thus a mask is formed against diffusion of impurities.

Next, the silicon oxide layer on the surface of the p type silicon single crystal opposite to the flat surface 22 is eliminated by etching, so that silicon is exposed over a diameter of 0.7 mm to 0.9 mm. And next, phosphorus diffusion is performed on the exposed surface of the silicon single crystal, so that a n$^+$ type region 24 of depth 1 μm is provided in the form of a spot, and thereby a deep pn$^+$ junction 25 is formed. Next, phosphorus diffusion is performed again for a short time while omitting the flat surface 22 and the silicon oxide layer on a portion around it, and thereby a new n type diffusion layer 26 is provided on the greater portion of the spherical surface up to a position around 0.3 μm in depth, so that a shallow partially spherical pn junction 27 is formed. And finally, a SiN layer is formed over the entire spherical surface by a known CVD method, so that a reflection prevention layer 34 is formed that also serves for passivation.

Figure 10:
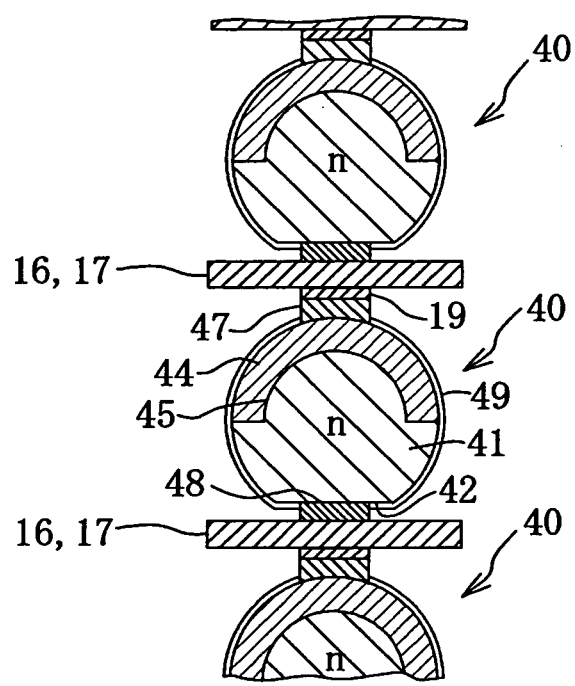
FIG. 10 is an enlarged sectional view of plural bypass diodes and of the essential portions of a plurality of lead members.

Next, the construction of the spherical bypass diodes 40 will be explained. As shown in FIG. 10, the bypass diode 40 comprises: a spherical semiconductor 41 made from an n type semiconductor (a single silicon crystal); a flat surface 42 made by grinding a portion of the surface of this spherical semiconductor 41; a p$^+$n junction 45 in the form of a partially spherical surface, made by forming a p$^+$ type diffusion layer 44 on a portion of the outer layer of the spherical semiconductor 41; a pair of an anode 47 and a cathode 48 (corresponding to the "second electrically conductive connection portions"), formed on the outer layer portion of the spherical semiconductor 41 on opposite sides of its center, thus electrically connected to both end of p$^+$n junction 45 at its two ends; and a protective surface layer 49 that is formed over all portions except for the anode 47 and the cathode 48. The cathode 48 is connected with low resistance to the central portion of the flat surface 42 of the spherical semiconductor 41, and the anode 47 is connected with low resistance to the p$^+$ type diffusion layer 44.

These bypass diodes 40 are connected in inverse parallel to a plurality of spherical solar cells 20 via the lead pieces 16 at both ends of each row of the matrix, and via the plurality of intermediate lead pieces 17. These bypass diodes 40 are spherical, and of similar size to the spherical solar cells 20. Since it will be acceptable if, at least, bypass diodes 40 are provided at the both end portions of each row, accordingly the bypass diodes that are connected to the intermediate lead pieces 17 may be omitted, and, instead of them, solar cells 20 may be provided.

Next, a method for producing these spherical bypass diodes 40 will be explained simply.

First, an n type spherical silicon single crystal 41 is prepared, having a similar diameter to that of the spherical solar cell 20. And a flat surface 42 is formed on a portion of this spherical n type silicon single crystal. Then, in a similar manner to that described above, an SiO$_2$ layer is provided as an impurity diffusion mask on the surface of the lower hemispherical portion of the n type silicon single crystal 41, centered around this flat surface 42. Boron is then diffused into the remaining exposed surface of the n type semiconductor 41, so that a p$^+$ type region 44 is provided of depth around 10 µm. Due to this, a p$^+$n junction 45 is formed. Furthermore, a surface layer of Si$_3$N$_4$ is formed over the entire spherical surface in a similar manner to that described above, so that a protective layer 49 is formed that also serves for passivation.

This bypass diode 40 is endowed with the function of a rectification diode, and is not required to generate any photoelectromotive force. For this reason, it would also be possible to use a rectification diode having a planar p n junction, instead of the spherical bypass diode 40. However it is necessary for it to be of a type having a characteristic in the forward direction at a level that, when a reverse voltage is applied by a solar cell with which it is connected in inverse parallel, can bypass that current.

In this manner, the solar cell 20 is electrically connected to the lead strings 15 by the pair of the positive and negative electrodes 31 and 32 (the first electrically conductive connection portions) that are formed in the shape of dots at the both ends of the spherical semiconductor 21 on the axial line parallel to the column direction through its center and connected with low resistance at the both ends of the pn$^+$ junction 25 and the pn junction 27. And, the bypass diode 40 is electrically connected to the lead pieces 16, 17 by the pair of the anode 47 and the cathode 48 (the second electrically conductive portions) that are formed on the axial line parallel to the column direction through its center in the shape of dots at the both ends of the bypass diode 40.

Figure 8:
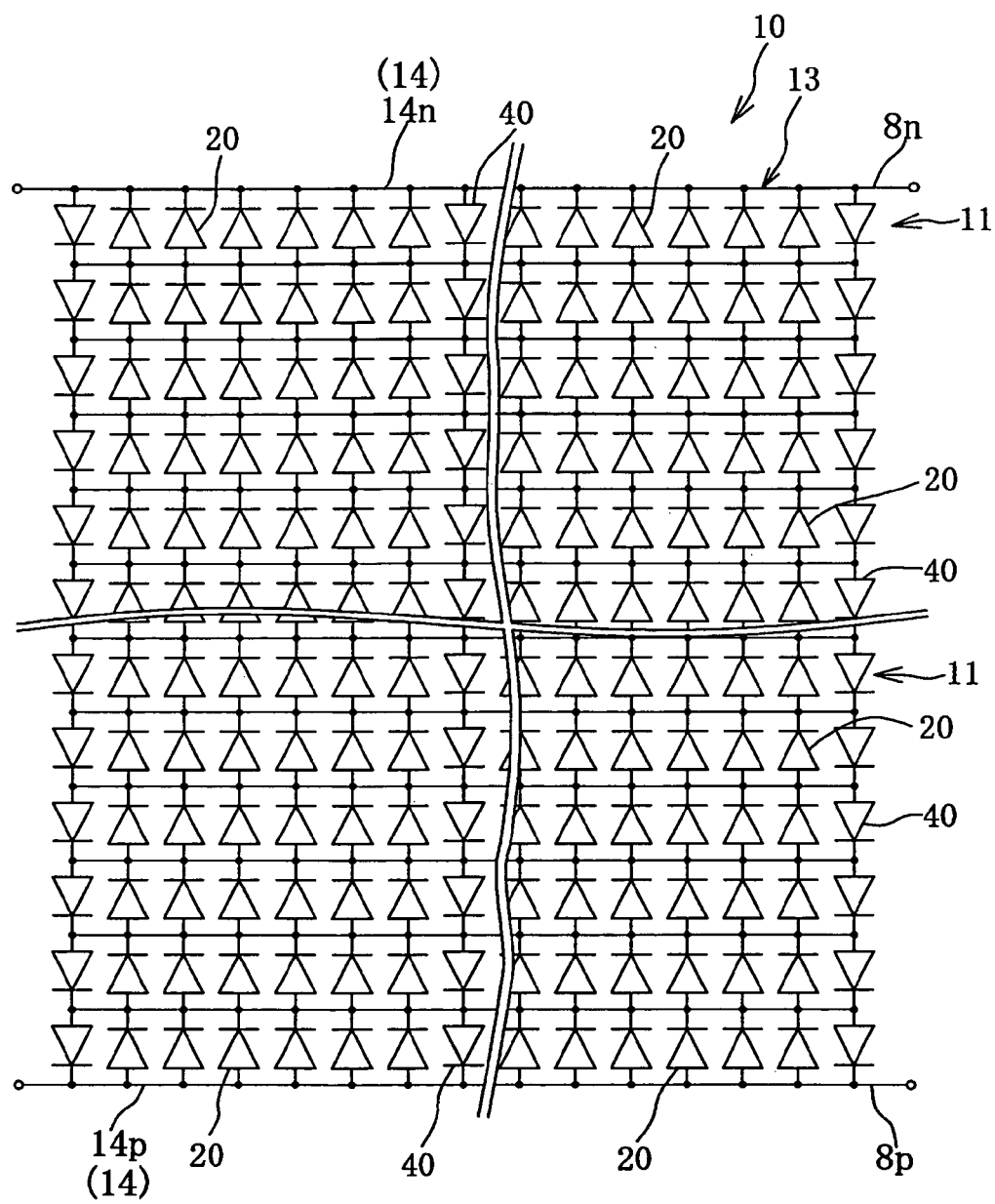
FIG. 8 is an equivalent circuit diagram of the solar cell assembly.

Next, an equivalent circuit diagram for this solar cell module 1 will be explained. FIG. 8 is an equivalent circuit diagram for a solar cell module 1 having a plurality of solar cells 20 and a plurality of bypass diodes 40 arranged in the matrix form having a plurality of rows and a plurality of columns. An example will be explained of a case in which the plurality of solar cells 20 provided to this solar cell module 1 are arranged in 15 rows and 12 columns.

If, for example, the open circuit voltage of a single solar cell 20 is 0.6 V, then a voltage of 9.0 V will be generated, since 15 solar cells 20 are connected in series between the positive electrode 14p and the negative electrode 14n. And, if the current generated by a single solar cell 20 is termed I, then a current of 12·I will be outputted from the positive electrode Pip to an external circuit, since 12 of the solar cells 20 are connected in parallel.

In order to increase the output voltage of the module 1, the number of solar cells 20 that are connected in series should be increased. And, in order to increase the output current of the module 1, the number of solar cells 20 that are connected in parallel should be increased.

Next, a manufacturing method for manufacturing this solar cell module 1 will be explained on the basis of FIGS. 11 to 16.

First, in a first process, a plurality of the spherical solar cells 20 are prepared in advance, each having a p type spherical semiconductor 21, a pn$^+$ junction 25 made in spot form on a part of the outer layer of this spherical semiconductor 21, a pn junction 27 like partially spherical surface, and a reflection prevention layer 34. In parallel with this, a plurality of the spherical bypass diodes 40 of similar size to the solar cells 20 are prepared in advance. It should be understood that, at this time, the solar cells 20 are in their states before the positive and negative electrodes 31, 32 are connected with low resistance to both ends of the pn$^+$ junction 25 and the pn junction 27, and the bypass diodes 40 are in their states before the anodes 47 and cathodes 48 are connected with low resistance to both ends of the pn junctions 45.

Figure 11:
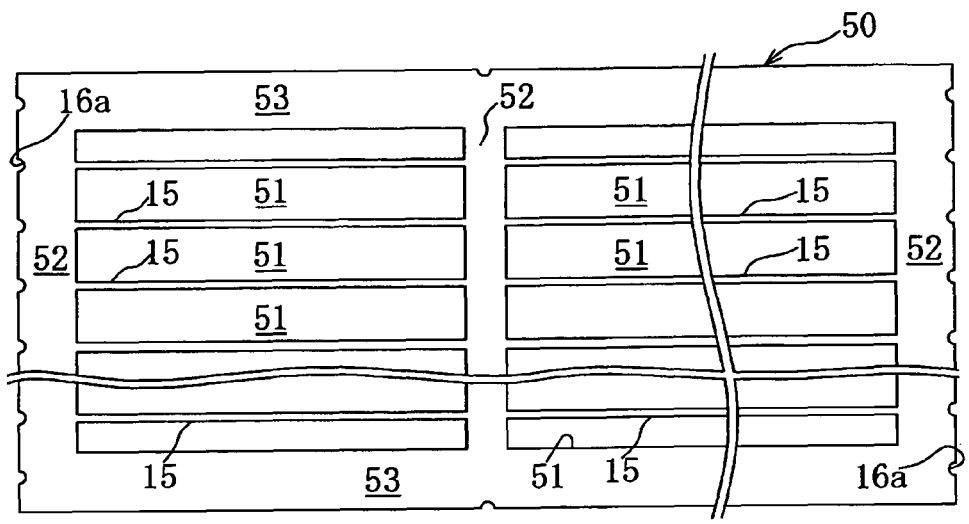
FIG. 11 is a plan view of a thin metallic sheet that is formed with a plurality of openings.

Next in a second process, as shown in FIG. 11, a plurality of openings 51 are made in the form of slits arranged in a plurality of rows and a plurality of columns by performing a punching out process or an etching process on a thin metallic sheet 50 of, for example, iron nickel alloy (of thickness approximately 0.3 mm) whose surface is plated with silver or nickel, so that a plurality of lead strings 15 each having a width less than or equal to the radius of the spherical solar cell 20 are formed between these plurality of openings 51, with one or more wider band portions 52 that are continuous along the column direction being formed at both end portions and between adjacent columns along the row direction, and with yet wider band portions 53 being formed at the upper edge portion and at the lower edge portion.

During punching out process or etching process, engagement portions 16a that consist of semicircular notches are formed on the external peripheral portion, corresponding to the lead strings 15 of the band portions 52. These engagement portions 16a are used in subsequent processes for forwarding the thin metallic sheet 50, and for positioning of a solar cell array 11 that will be described later.

Figure 12:
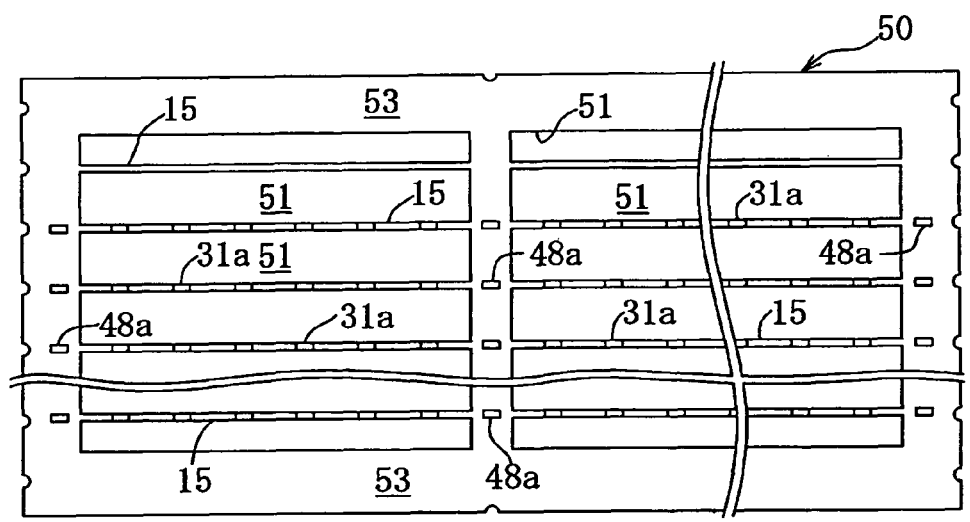
FIG. 12 is a plan view of the thin metallic sheet after a plurality of spots of electrically conductive paste have been applied to a plurality of lead strings and band portions.

Next, in a third process, as shown in FIG. 12, in order to connect a plurality of the spherical solar cells 20 on each of the lead strings 15, except for the lead string 15 at the uppermost edge, an electrically conductive paste in the semi solid state (this is a paste of Ag to which Al and glass frit have been added, and corresponds to the "first conductive connection material") is applied thereto in the form of a plurality of spots 31a.

At the same time, in order to connect a plurality of the bypass diodes 40 at a plurality of sites on the band portions 52 corresponding to the plurality of lead strings 15, except for the lead string 15 at the uppermost edge, an electrically conductive paste in the semi solid state (this is a paste of Ag to which glass frit has been added, and corresponds to the "second conductive connection material") is applied thereto in the form of a plurality of spots 48a. The thickness at which these electrically conductive paste spots 31a, 48a is applied is around 0.3 mm to 0.5 mm.

Figure 13:
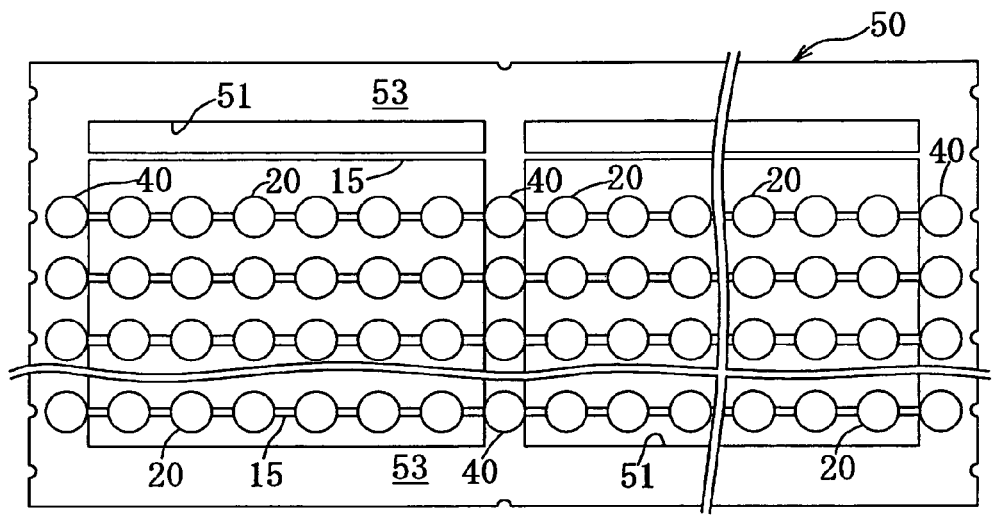
FIG. 13 is a plan view of the thin metallic sheet after a plurality of spherical solar cells and plural bypass diodes have been placed on a plurality of spots of electrically conductive paste.

Next, in a fourth process, as shown in FIG. 13, the flat surfaces 22 of a plurality of the solar cells 20 are connected respectively to each of the plurality of spots 31a of electrically conductive paste that have been applied on the lead strings 15. At the same time, the flat surfaces 42 of a plurality of the bypass diodes 40 are connected respectively to each of the plurality of spots 48a of electrically conductive paste that have been applied on the band portions 52.

Figure 14:
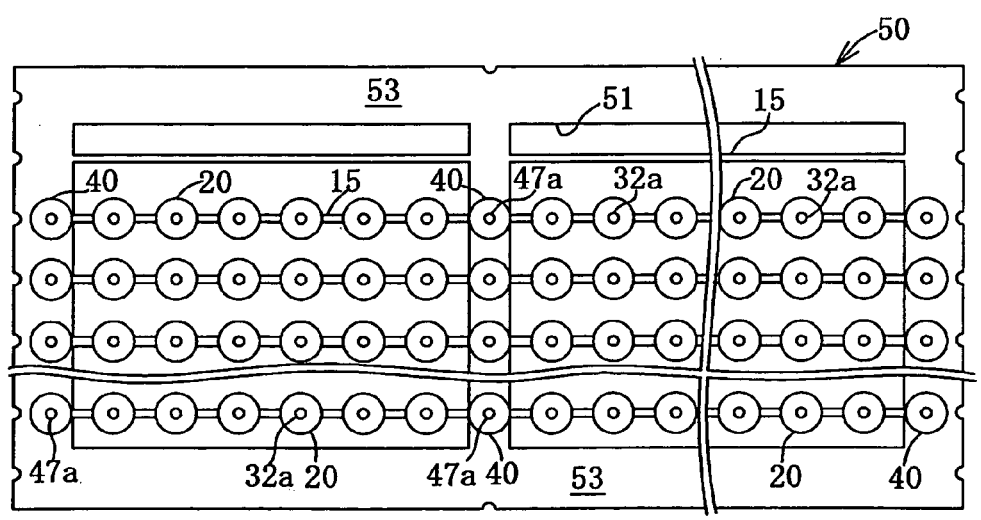
FIG. 14 is a plan view of the thin metallic sheet after spots of electrically conductive paste have been applied to the summit portions of a plurality of spherical solar cells and plural bypass diodes.

Next, in a fifth process, as shown in FIG. 14, an electrically conductive paste (this is a paste of Ag to which glass frit has been added, and corresponds to the "first conductive connection material") is applied to the summit portion of each of the plurality of solar cells 20, in the form of a plurality of spots 32a. At the same time, an electrically conductive paste (this is a paste of Ag to which Al and glass frit has been added, and corresponds to the "second conductive connection material") is applied to the summit portion of each of the plurality of bypass diodes 40, in the form of a plurality of spots 47a. These spots 32a, 47a of electrically conductive paste that are applied to the summit portions are of diameter about 0.5 mm and thickness 0.2 mm to 0.3 mm.

Next, in a sixth process, the thin metallic sheet 50 with the plurality of solar cells 20 and the plurality of bypass diodes 40 thus arranged on it is placed in an atmosphere of nitrogen gas at around 750° C., and thereby heat is rapidly applied over a short time period, thus hardening the spots of electrically conductive paste 31*a*, 32*a*, 47*a*, and 48*a*. At this time, the spots 31*a*, 32*a* of electrically conductive paste pierce through the reflection prevention layers 34 of the solar cells 20, and are electrically connected at low resistance to the surface of the semiconductor directly under them. In a similar manner, the spots 47*a*, 48*a* of electrically conductive paste pierce through the surface protective layers 49 of the bypass diodes 40, and are connected at low resistance to the surface of the semiconductor directly under them. By doing this, the positive and negative electrodes 31, 32 of the solar cells 20 (i.e., the "first conductive connection portions") are formed, and also the anodes 47 and cathodes 48 of the bypass diodes 40 (i.e., the "second conductive connection portions") are formed.

Figure 15:
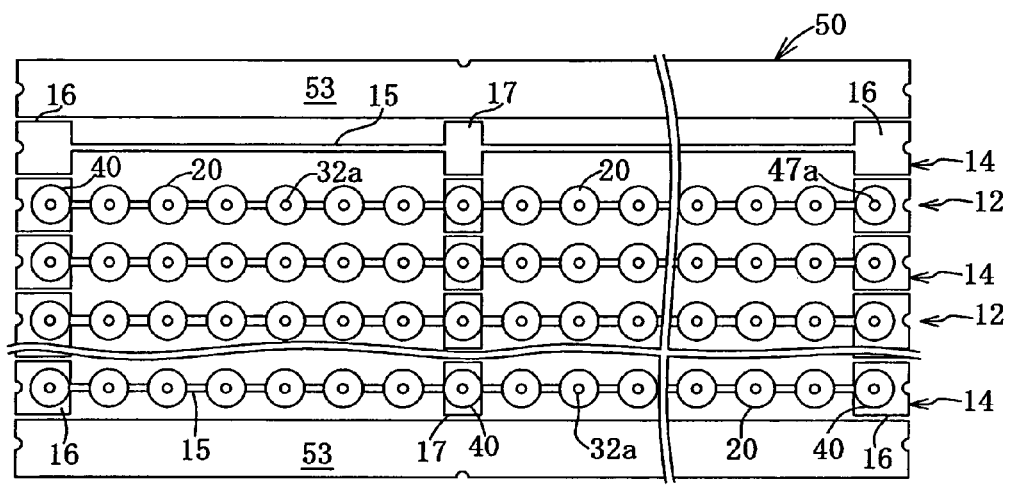
FIG. 15 is a plan view of a plurality of solar cell sub arrays that have been made by dividing the thin metallic sheet into sections.

Next, in a seventh process, as shown in FIG. 15, the band portions 52 of the thin metallic sheet 50 are made into the lead pieces 16 and the intermediate lead pieces 17 by dividing them into sections by die punching or with a laser beam, at intermediate positions corresponding to the openings between the lead strings 15. Thus, a plurality of solar cell sub arrays 12 are manufactured having the same shape and also the same dimensions, including, for each row, a plurality of spherical solar cells 20, plural bypass diodes 40, plural lead strings 15, plural lead pieces 16, and one or plural intermediate lead pieces 17.

Next, in an eighth process, for each of these solar cell sub arrays 12, an electrically conductive material 19 in paste form is applied to each of the negative electrodes at the summit portions of the plurality of spherical solar cells 20, and to each of the anodes 47 at the summit portions of the plural bypass diodes 40.

Next, in a ninth process, by the lead pieces 16 at both ends of the solar cell sub arrays 12 being grasped by a pair of hands of an automatic assembly device, and by the engagement portions 16*a* of the lead pieces 16 being engaged to a pair of guide members of the automatic assembly device, the plurality of solar cell sub arrays 12 are sequentially laminated together while being guided and positioned via the pairs of lead pieces 16. Finally the lead member 14 at the upper edge portion, on which no solar cells 20 or bypass diodes 40 are provided, is laminated on to the assembly, and thereby the plurality of spherical solar cells 20 and the plurality of bypass diodes 40 are assembled into a solar cell assembly 10 in the matrix form having a plurality of rows and a plurality of columns.

Figure 16:
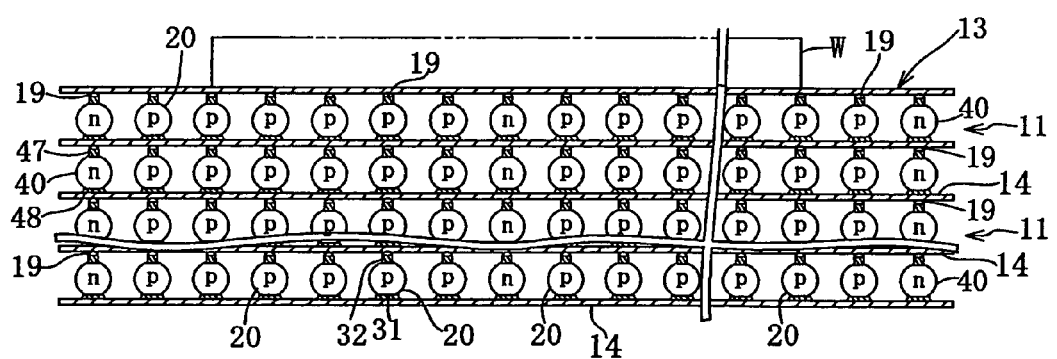
FIG. 16 is an elevation view of a solar cell assembly in matrix form made by laminating and adhering together the plurality of solar cell sub arrays.

Next, in a tenth process, as shown in FIG. 16, a weight W is mounted on the upper edge of the cell assembly 10 in matrix form, and the electrically conductive connection material 19 is hardened and the solar cell assembly 10 is manufactured by subjecting the cell assembly 10 to heating processing in the state in which it is being compressed by the weight W in the column direction. Thereafter, a plurality of external leads 8*p*, 8*n* are connected to the lead members 14 along the upper and the lower edge of the solar cell assembly 10 by solder (the electrically conducting junction members) using a laser beam.

Next, in an eleventh process, in order to seal the solar cell assembly 10 between a pair of panel members 3, 4, it is disposed between the panel members 3, 4 together with a transparent sheet of synthetic resin. Among the panel members 3, 4, at least one of the panel members that is positioned on the incident side of sunlight will be is made from a transparent material. The panel members 3, 4 with this solar cell assembly 10 sandwiched between them are loaded into the lower chamber of a predetermined laminator device that has upper and lower containment chambers, and heat is applied with a heater while vacuum exhausting these upper and lower chambers.

After a fixed time period a gas is introduced into the upper chamber, heat is applied at around 150° C. while applying pressure to the panel members 3, 4 on both sides due to the pressure difference between the upper chamber and the lower chamber, and then the apparatus is returned to a normal temperature. Due to this, the transparent synthetic resin sheet is melted and hardened, so that the solar cell assembly 10 which is disposed between the panel members 3, 4 is resin sealed with the transparent filler material 6, along with the panel members 3, 4 on both sides being adhered thereto. In this manner, it is possible to manufacture a single solar cell module 1.

Next, the advantages of the solar cell module 1 and its manufacturing method of the present invention will be explained. According to this solar cell module 1, the lead members 14 include one or plural lead strings 15 respectively to which the plurality of spherical solar cells 20 are electrically connected and that have width less than or equal to the radius of the spherical solar cell 20, and the plurality of lead pieces 16, 17 that are formed integrally with the lead strings 15 at least at both end portions of the lead members 14 and to which the bypass diodes 40 are electrically connected, and that have width greater than or equal to the width of the bypass diodes 40. Therefore, when the solar cell sub array 12 is manufactured in which the plurality of spherical solar cells 20 and the plural bypass diodes 40 are attached to the single lead member that includes plural lead strings 15 and plural lead pieces 16, 17, and when laminating together a plurality of these solar cell sub arrays 12 in multiple layers, it is possible for the lead pieces 16 to be grasped by the hands of an automatic assembly device. Since it is also possible to form engagement portions 16*a* or positional determination on the lead pieces 16, for guiding the sub arrays 12 and determining their positions during lamination, accordingly a solar cell module 1 can be assembled efficiently by an automatic assembly device.

Moreover there is an advantage during the resin sealing process when resin sealing the cell assembly 10 (i.e. the module main body portion) while it is sandwiched between panel members 3, 4, since it is possible to set the gap between the pair of panel members 3, 4 by sandwiching the plurality of lead pieces 16 and the plurality of intermediate lead pieces 17 between the pair of panel members 3, 4.

Since the plurality of spherical solar cells 20 are installed, accordingly the solar cell module 1 is capable of photoelectrically converting incident light received in directions over a very wide range. Due to this, the light utilization efficiency becomes greater, since it is possible to generate electricity not only from light that is directly incident, but also from light that is reflected and scattered internally to the solar cell module 1 and from diffused light. If both of these flat shaped panel members 3, 4 are made from a transparent material, then the solar cell module is produced that is capable of generating electricity by receiving light from both sides.

Since, along with connecting the plurality of solar cells 20 in series and also in parallel with the electrically conductive connecting mechanism 13 that is formed like a mesh and in which the plurality of lead strings 15 are arranged in the form of a matrix having a plurality of rows and a plurality of columns, also the bypass diodes 40 are connected in inverse parallel to the plurality of solar cells 20 of each row, accordingly, even if this solar cell module 1 is partially shielded from the sunlight and the output from some of its solar cells 20 ceases, due to the bypass diodes 40, no hindrance is caused to the output of the other spherical solar cells 20, and it is possible to prevent excessively great reverse voltage from being applied to some of the spherical solar cells 20 that are shielded from the sunlight.

Since it is possible to keep the amount of shielding of sunlight that is directly incident on the solar cell module 1 small due to the lead strings 15 having width less than or equal to the radius of the spherical solar cell 20, accordingly it is possible to enhance the efficiency of light utilization. Since, in the case of this solar cell module 1 that is formed as a flat plate, both lighting and through vision are possible via the gaps between the solar cells 20, therefore, according to the density of the plurality of solar cells 20 with respect to the module 1, free design becomes possible for selection of the electricity generation capability, and for selection of the ratio between illumination capability and light shielding capability. Moreover, it is possible to use this solar cell module 1 for a window material, i.e. as laminated glass that is capable of generating electricity from sunlight, and furthermore it is possible to reduce the overall material costs and the costs of installation Since, according to the manufacturing method for producing the solar cell module 1 as described above, a plurality of the solar cell sub arrays 12 are manufactured, and these sub arrays 12 are sequentially laminated together and are assembled into the cell assembly 10 in matrix form hike a panel, accordingly it becomes possible to sandwich those matrix form cell assembly 10 between the panel members 3, 4 and to perform resin sealing thereof. Due to this, it becomes possible to resin seal this cell assembly 10 between the pair of panel members 3, 4 without using any die having a complicated construction. For this reason, it is possible to reduce the manufacturing cost of the solar cell module 1, and it becomes possible to increase the size of the solar cell module 1.

Since the lead pieces 16 are integrally formed at both end portions of the lead members 14, and thus, after having manufactured the plurality of solar cell sub arrays 12, during lamination and assembly thereof, it is possible for the lead pieces 16 to be grasped by the hands of an automatic assembly device, and for positioning of the sub arrays 12 to be performed by using the lead pieces 16, accordingly it is possible to assemble the solar cell module 1 efficiently and with good accuracy. And, during the process of resin sealing the cell assembly 10, it is possible to set the gap between the pair of panel members 3, 4 by sandwiching the plurality of lead pieces 16, 17 between the pair of panel members 3, 4.

Embodiment 2

In this Embodiment #2, an example is shown of a solar cell module 1A that is partially altered from that of Embodiment #1; thus, to elements that are similar to ones of Embodiment #1, reference symbols that are the same or similar are appended and explanation thereof is omitted, with only those constitutions that are different from those of Embodiment #1 being explained. This solar cell module 1A has a light reception surface that is made in the form of a plurality of partially cylindrical surfaces, and is one that can be applied as a solar cell module that also serves as a roof tile.

Figure 19:
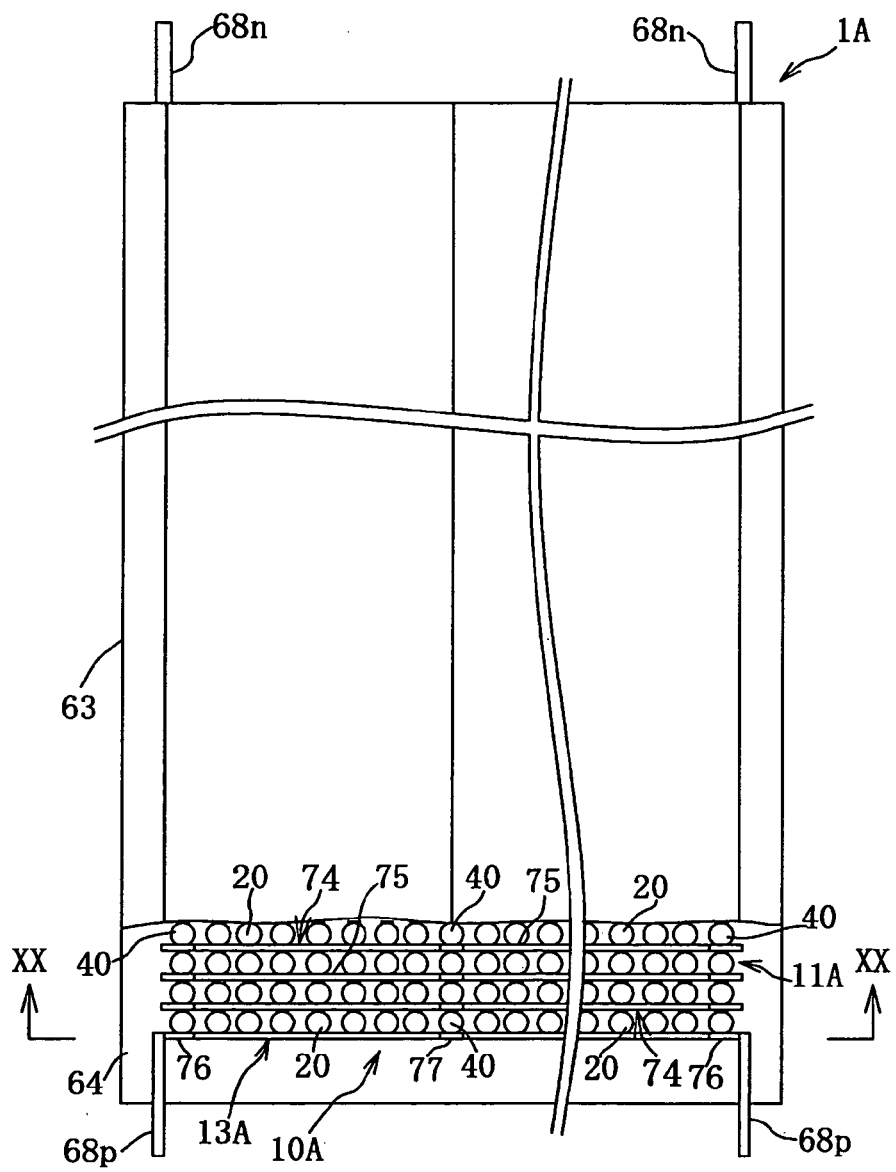
FIG. 19 is an elevation view of a solar cell module according to a second embodiment.
Figure 20:
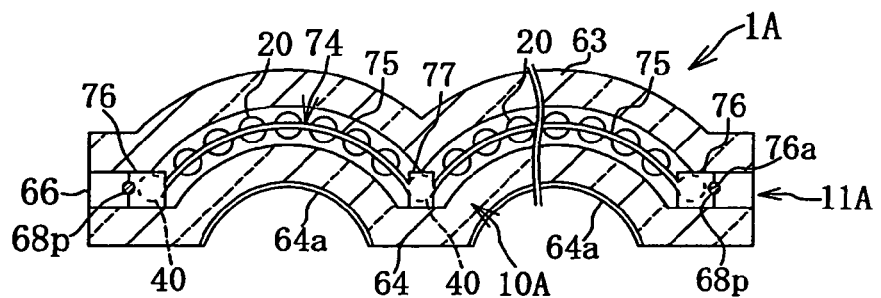
FIG. 20 is a sectional view taken along lines XX XX of FIG. 19.

As shown in FIGS. 19, 20, this solar cell module 1A comprises: first and second curved panel members 63, 64 that have a plurality of partially cylindrical surfaces; a solar cell assembly 10A that is sandwiched between the curved panel members 63, 64; transparent synthetic resin 66 charged between the curved panel members 63, 64; and a plurality of external leads 68p, 68n for outputting the electric output of the plurality of spherical solar cells 20 to the exterior. Up, down, left and right in FIG. 19 are explained as being up, down, left and right, and it is supposed that the front side of the drawing paper in FIG. 19 is the incident side of sunlight.

As shown in FIG. 20, the first curved panel member 63 closes over the surface of the solar cell module 1A on the incident side of sunlight, and is made from transparent material in a shape along a plurality of partially cylindrical surfaces. And the second curved panel member 64 closes over the surface of the solar cell module 1A on the side opposite to the incident side of sunlight, and moreover is made from transparent material in a shape along a plurality of partially cylindrical surfaces.

The gap between the curved panel members 63, 64 is set by a plurality of lead pieces 76 and a plurality of intermediate lead pieces 77 being sandwiched between the curved panel members 63, 64. A reflective layer 64a or a printed layer 64a on which ornamentation has been performed is provided on the parts of the outer surfaces of the second panel member 64 that follow the partially cylindrical surfaces. And transparent synthetic resin 66 is charged between the curved panel members 63, 64, thus sealing the cell assembly 10A with resin.

The end portions of the two external leads 68p at the lower edge of the solar cell module 1A are each adhered with an electrically conductive adhesive material to engagement portions 76a of the lead pieces 76 at the two end portions of the lead member 74 at the lowermost edge of the cell assembly 10A, and thus are electrically connected to the positive electrodes 31 of the plurality of solar cells 20 and to the cathodes 48 of the plurality of bypass diodes 40 on the lowermost edge of the matrix. And the end portions of the two external leads 68n at the upper edge of the solar cell module 1A are each adhered with an electrically conductive adhesive material to engagement portions 76a of the lead pieces 76 at the two end portions of the lead member 74 at the uppermost edge of the cell assembly 10A, and thus are electrically connected to the negative electrodes 32 of the plurality of solar cells 20 and to the anodes 47 of the plurality of bypass diodes 40 on the uppermost edge of the matrix.

Next, the solar cell assembly 10A will be explained. The solar cell assembly 10A comprises a plurality of spherical solar cells 20 that are arranged in the matrix form having a plurality of rows and a plurality of columns, a plurality of bypass diodes 40 that are connected in inverse parallel with these spherical solar cells 20, and an electrically conductive connecting mechanism 13 for connecting these in parallel and also in series. A plurality of solar cell arrays are made in the form of a plurality of partially cylindrical surfaces (refer to FIG. 20) that extend along the row direction of the matrix connected at one or plural inflection points dividing equally along rows of the matrix form. It would also be acceptable to make the solar cell assembly in the form of two partially cylindrical surfaces or a single partially cylindrical surface with no inflexion point.

A plurality of solar cell arrays 11A constitute the solar cell assembly 10A. In each solar cell array 11A, in each pair of lead members 74, seven (for example) solar cells 20 are arranged on each of a plurality of lead strings 75 that are formed as circular arcs, bypass diodes 40 are arranged on lead pieces 76 at both ends of the lead member 74 and on each of the plurality of intermediate lead pieces 77, and these are sandwiched between a pair of lead members 74, 74. The directions of electrical conduction of all of the spherical solar cells 20 in the plurality of rows are all aligned in the same direction (the column direction). Solar cell arrays 11A that are adjacent in the column direction of the matrix share the lead members 74 that are positioned between those solar cell arrays 11A. The pluralities of spherical solar cells 20 for each column and the pluralities of bypass diodes 40 for each column are connected in series via the plurality of lead members 74.

Next, the electrically conductive connecting mechanism 13A will be explained. As shown in FIG. 19, the electrically conductive connecting mechanism 13A is a connection circuit like a mesh in which, via the plurality of lead members 74 that are disposed at a plurality of positions between the rows of the matrix and at both ends of the matrix in the column direction, the plurality of solar cells 20 and the plurality of bypass diodes 40 for each row are connected in parallel, and the plurality of solar cells 20 in each of the plurality of columns are connected in series and the plurality of bypass diodes 40 in each of the plurality of columns are connected in series. Each of these lead members 74 includes plural lead strings 75 that are shaped as circular arcs and that have width less than or equal to the radius of the spherical solar cells 75, wider lead pieces 76 at both end portions of the lead member 74, and a plurality of intermediate wider lead pieces 77 at inflexion point.

Lead pieces 76 are formed integrally with the lead strings 75 at both end portions of each of the lead members 74, and are disposed orthogonally to the column direction of the matrix and have width in the direction orthogonal to the row direction of the matrix greater than or equal to the width of the bypass diodes 40. And, in each of the lead members 74, intermediate lead pieces 77 are formed integrally with the lead strings 75 at intermediate portions corresponding to plural inflexion points dividing equally in the row direction of the matrix. Since the construction of each row for connecting the plurality of solar cells 20, the plurality of bypass diodes 40, and the pair of lead members 74 are the same as the electrically conductive connecting mechanism 13 of Embodiment #1, accordingly explanation thereof will be omitted.

Next a manufacturing method for manufacturing the solar cell module 1A will be explained on the basis of FIGS. 21 to 25; but explanation of features that are the same as ones of Embodiment #1 above will be omitted.

Figure 21:
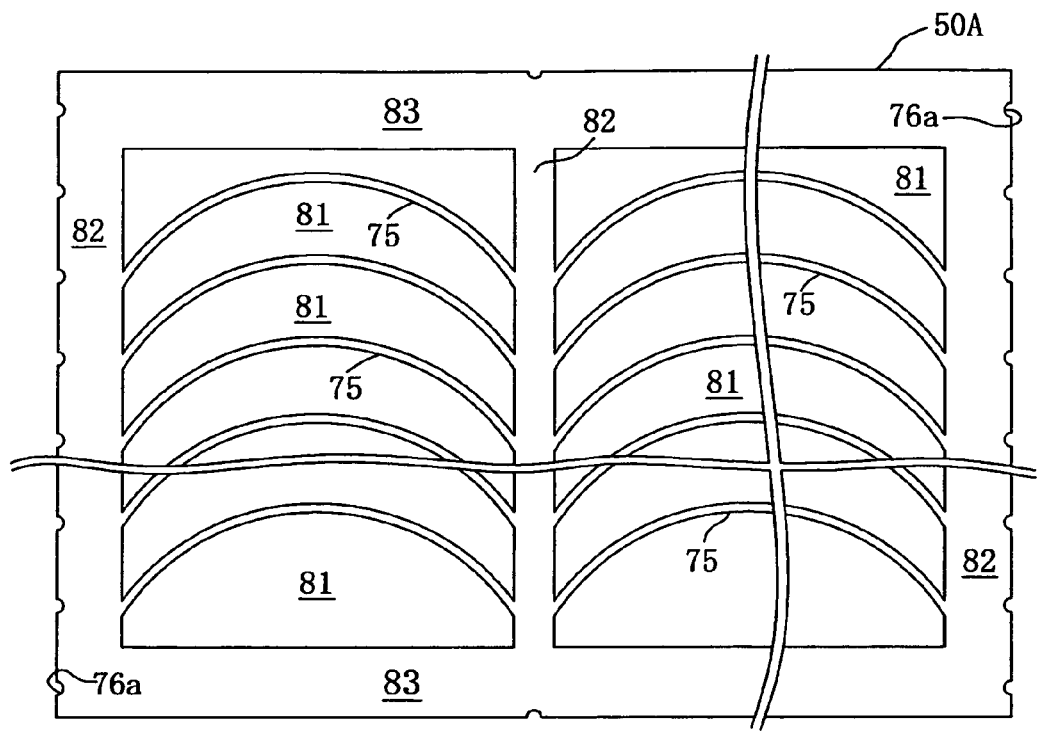
FIG. 21 is a plan view of a thin metallic sheet that is formed with plural slit shaped openings arranged in plural rows and plural columns.

First, in a first process, a plurality of the spherical solar cells 20 and a plurality of the bypass diodes 40 are prepared in advance, in a similar manner to Embodiment #1. Next, in a second process, as shown in FIG. 21, by performing a punching out process or an etching process on a thin metallic sheet 50A similar to the one used in Embodiment #1, a plurality of openings 81 are provided in the form of slits arranged in a plurality of rows and a plurality of columns. Along with the openings 81 in the shapes of circular arcs being formed in the form of slits, a plurality of lead strings 75 for each column are made in the shape of circular arcs, and pluralities of band portions 82, 83 and a plurality of engagement portions 76a formed on the plurality of band portions 82 are also made.

Figure 22:
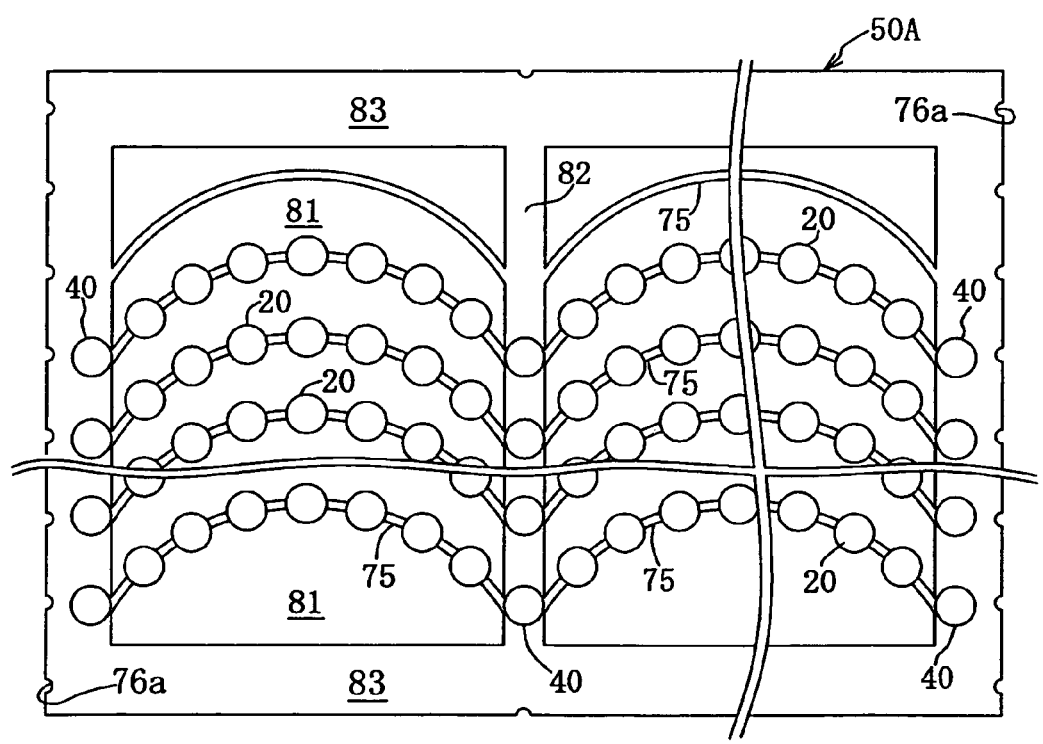
FIG. 22 is a plan view of the thin metallic sheet after a plurality of spherical solar cells and plural bypass diodes have been placed on a plurality of spots of electrically conductive paste.
Figure 23:
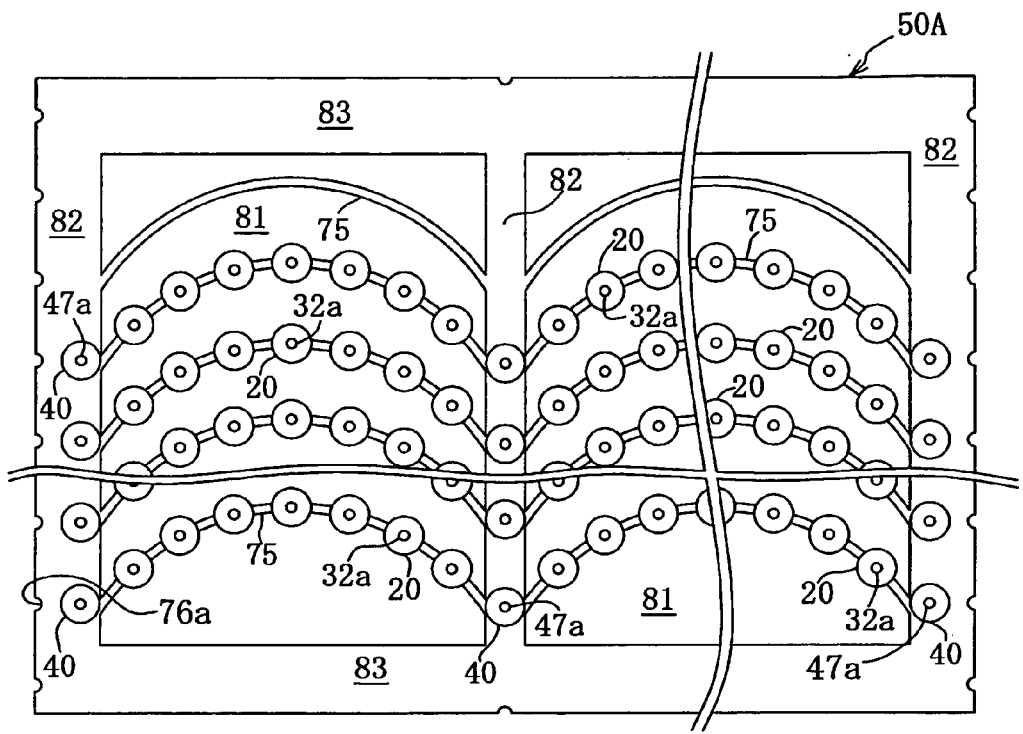
FIG. 23 is a plan view of the thin metallic sheet after spots of electrically conductive paste have been applied to the summit portions of the plurality of spherical solar cells and the plural bypass diodes.

Next, in a third process, a plurality of spots 31a (not shown in the figures) of an electrically conductive paste for connecting a plurality of the spherical solar cells 20, are applied on the lead strings 75, and also a plurality of spots 48a (not shown) of an electrically conductive paste for connecting a plurality of the bypass diodes 40 are applied on the band portions 82 that correspond to these lead strings 75. And next, in a fourth process, as shown in FIG. 22, a plurality of solar cells 20 and a plurality of bypass diodes 40 are connected to the plurality of spots 31a, 48a. Next, in a fifth process, as shown in FIG. 23, electrically conductive paste is applied to the summits of the plurality of solar cells 20 and of the plurality of bypass diodes 40 in the form of spots 32a, 47a respectively.

Figure 24:
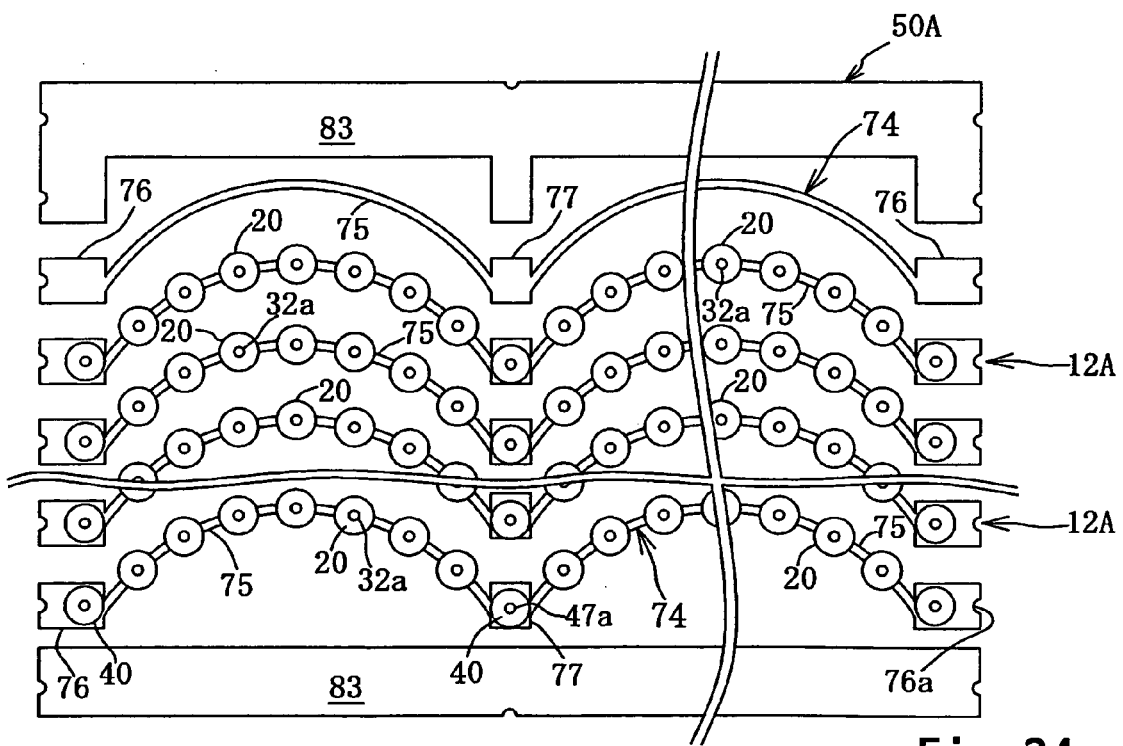
FIG. 24 is a plan view of a plurality of solar cell sub arrays made by dividing the thin metallic sheet into sections.
Figure 25:
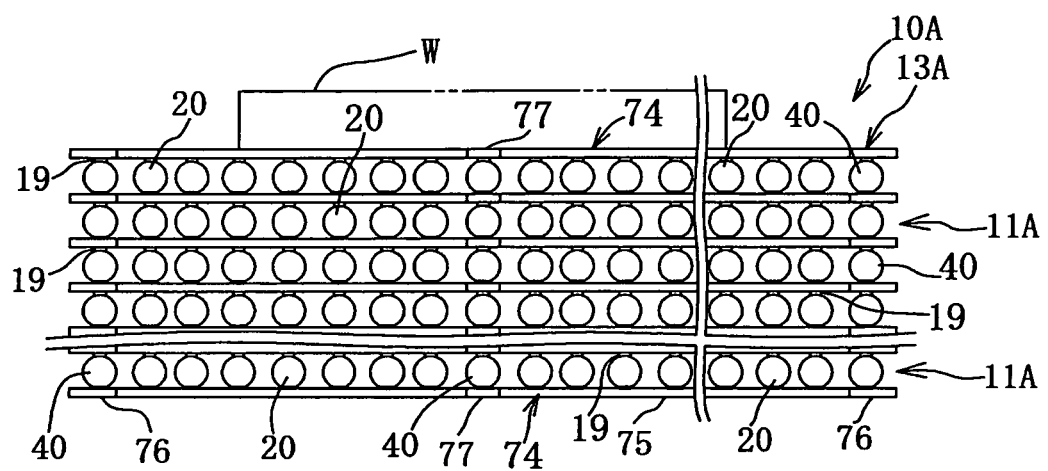
FIG. 25 is a side view of a cell assembly in matrix form in which a plurality of solar cell arrays are laminated and adhered together.

Next, in a sixth process, heat is rapidly applied to the thin metallic sheet 50A and the spots 31a, 32a, 47a, 48a are hardened. And next, in a seventh process, as shown in FIG. 24, the plurality of band portions 82 on the thin metallic sheet 50A are divided into sections by a punching out process or with laser light, so that lead pieces 76 and intermediate lead pieces 77 are formed, and thereby a plurality of solar cell sub arrays 12A having the same shape and the same dimensions are manufactured. Next, in an eighth process, in each of the solar cell sub arrays 12A, electrically conductive connection material 19 is applied to each of the negative electrodes at the summit portions of the plurality of spherical solar cells 20 and to each of the anodes 47 at the summit portions of the plurality of bypass diodes 40. And next, in a ninth process, as shown in FIG. 25, the plurality of solar cell sub arrays 12A are sequentially laminated together, so that the plurality of spherical solar cells 20 and the plurality of bypass diodes 40 are assembled into a solar cell assembly 10A in the form of a matrix having a plurality of rows and a plurality of columns.

Next, in a tenth process, the finished solar cell assembly 10A is formed by subjecting this cell assembly 10A to heating processing and by thus hardening the electrically conductive adhesive material 19. Thereafter, external leads 68p, 68n are soldered by a laser beam to the engagement portions 76a of the lead pieces 76 at the top edge and at the bottom edge in the column direction of the solar cell assembly 10A. And next, in an eleventh process, the solar cell assembly 10A in the form of a matrix is positioned between a pair of curved panel members 63, 64, transparent synthetic resin 66 is charged between the curved panel members 63, 64 via a transparent synthetic resin sheet and is thereafter subjected to heating processing, and thereby the solar cell module 1A is manufactured.

Next, the operation and the advantages of the solar cell module 1A and of the manufacturing method thereof will be explained.

Since, according to this solar cell module 1A, the light reception surfaces of the curved panel members 63, 64 are formed in the shape of a plurality of partially cylindrical surfaces, as contrasted with the panel members 3, 4 of Embodiment #1 described above which are formed as flat plates, accordingly the light reception surface is increased, and moreover it is possible to suppress fluctuations of the electric output of the solar cell module 1A, even if the direction of directly incident solar radiation changes along with the passage of time. A solar cell module 1A having surfaces of this type shaped as partial cylinders can be applied as a roof tile or as a wall material. Thus, it is possible to endow a solar cell module 1A of which the light reception surface is formed as partial cylinders with good freedom of design (designability).

As the reflective layer 64a, for example, it would also be acceptable to arrange to employ a thin layer made from metal whose reflectivity is high, or to employ a method of applying white colored ceramic paint by silk screen printing and then heat firing the result. It would also be acceptable to print ceramic paint having a desired color or design pattern, although the reflectivity would be reduced to a certain extent. In this case, apart from light that is reflected from and scattered by the reflective layer being received by the solar cells and thus increasing their photoelectric output, application is also possible as a solar cell panel of a type integrated with a building material in which an attractive design is incorporated, and which controls the visibility, the solar radiation, and the heat to be moderate. It should be understood that it would also be acceptable to apply this type of reflective layer to Embodiment #1 described above. Explanation of other features of the operation of this embodiment and of other benefits thereof will be omitted, since they are the same as those of Embodiment #1.

Embodiment 3

In this Embodiment #3, an example is shown of a solar cell module 1B that is partially altered from that of Embodiment #1; thus, to elements that are similar to ones of said Embodiment #1, reference symbols that are the same or similar are appended and explanation thereof is omitted, with only those constitutions that are different from those of Embodiment #1 being explained. This solar cell module 1B in one in which, by wiring up a plurality of lead terminals 81a, 81b that are provided on the exterior of the module 1B to external connection leads as desired, it is possible to set the voltage and the electric current outputted from the module 1B freely.

Figure 26:
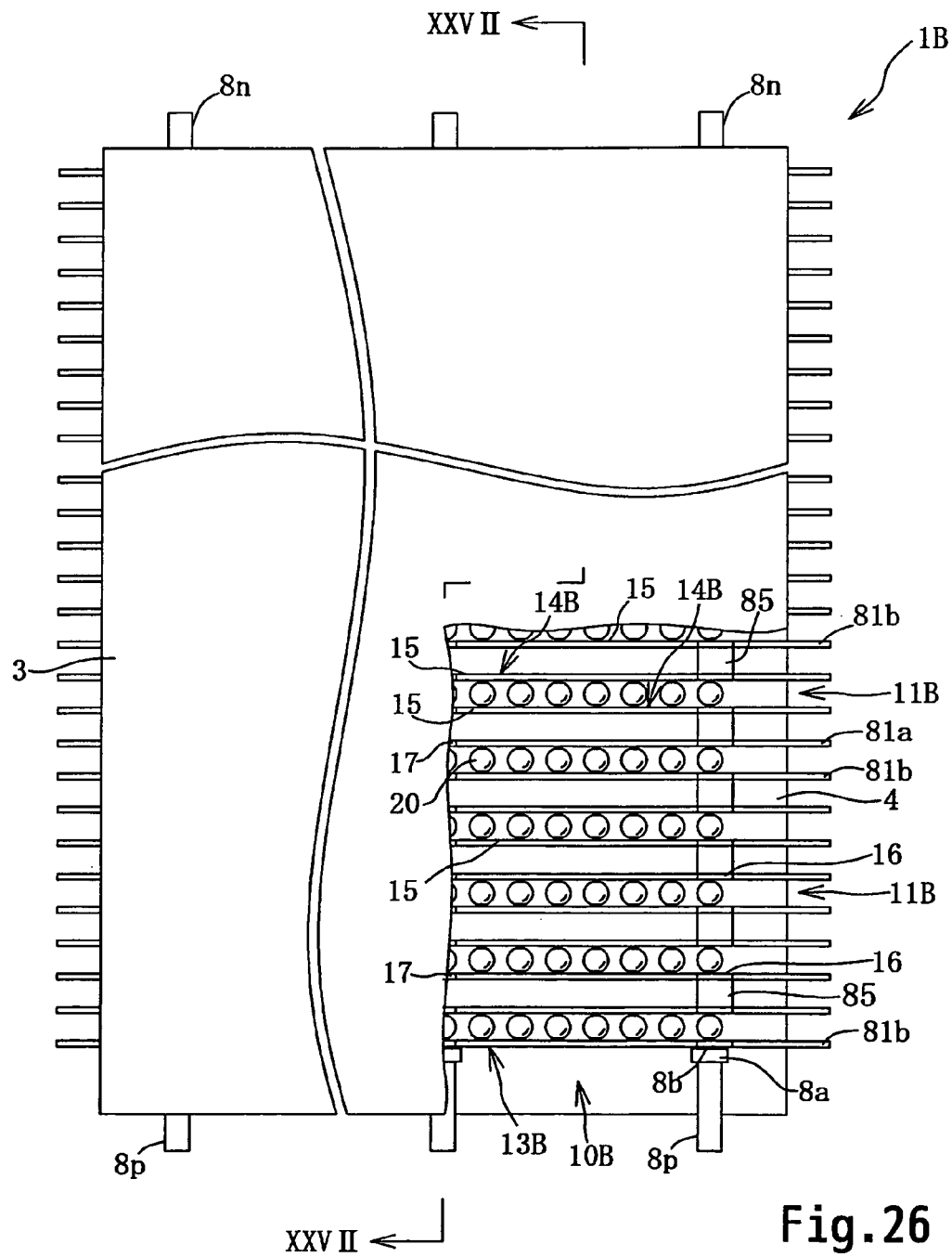
FIG. 26 is an elevation view of a solar cell module according to a third embodiment.
Figure 27:
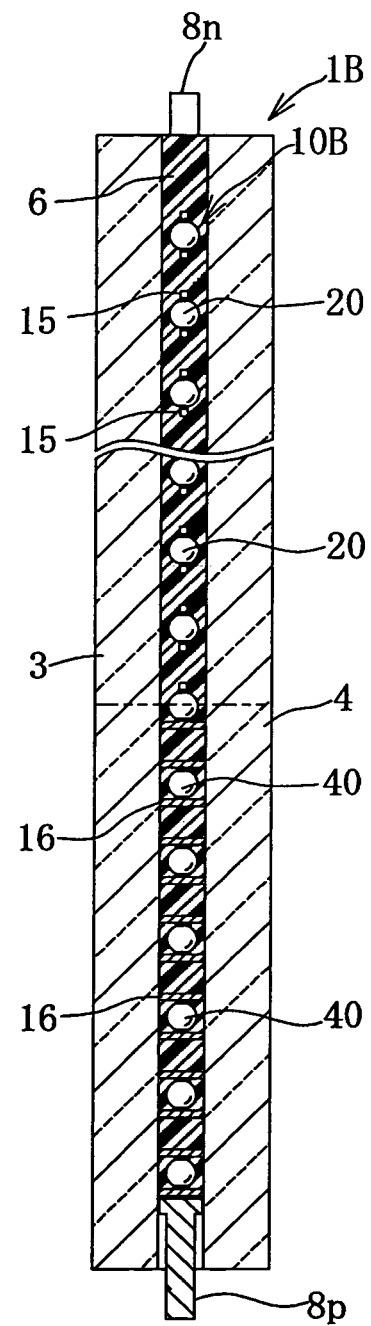
FIG. 27 is a sectional view taken along lines XXVII XXVII of FIG. 26.
Figure 28:
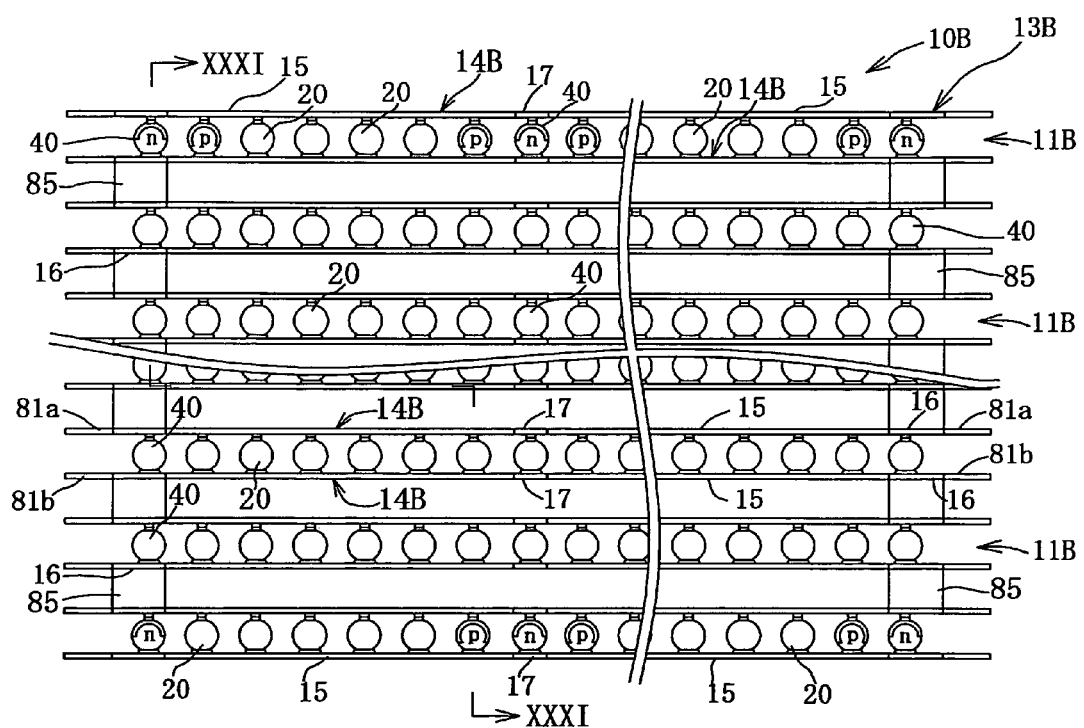
FIG. 28 is an elevation view of a solar cell assembly.
Figure 29:
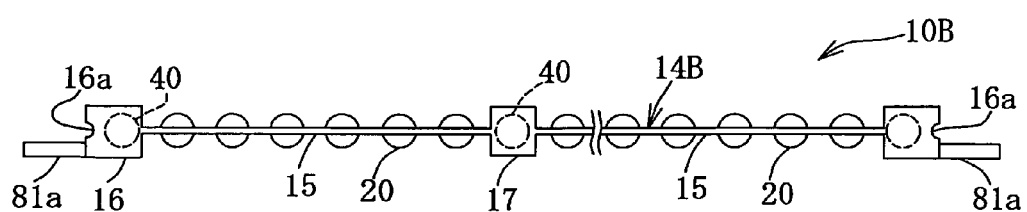
FIG. 29 is a plan view of the solar cell assembly.
Figure 30:
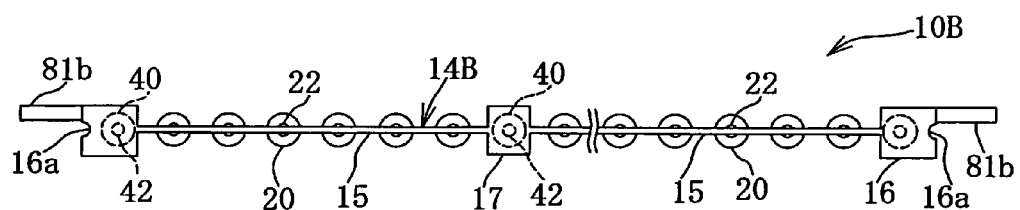
FIG. 30 is a bottom view of the solar cell assembly.
Figure 31:
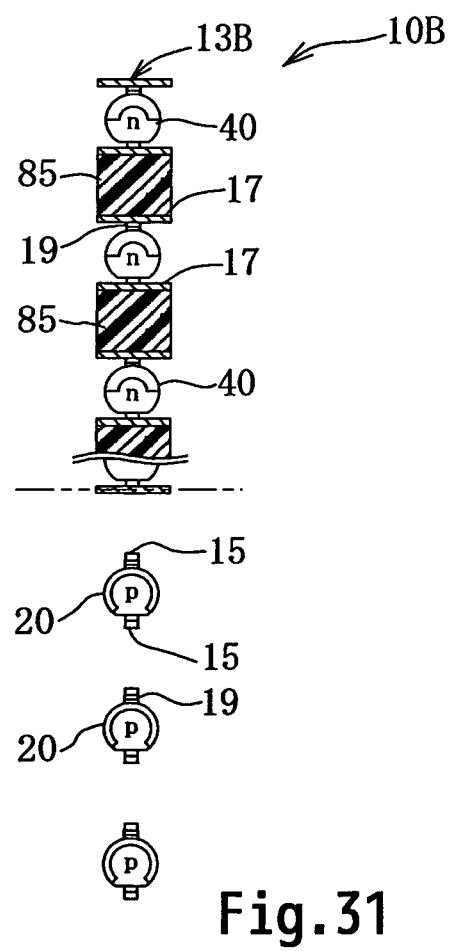
FIG. 31 is a sectional view taken along lines XXXI XXXI of FIG. 28.
Figure 32:
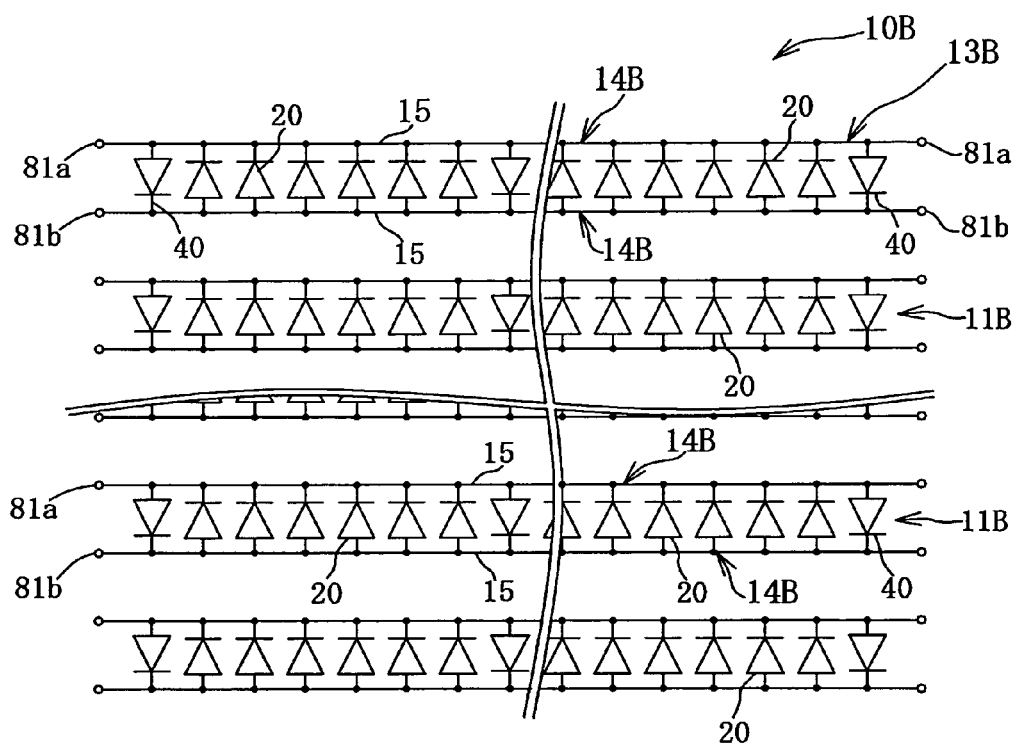
FIG. 32 is an equivalent circuit diagram of the solar cell assembly.

As shown in FIGS. 26, 27, this solar cell module 1B comprises a pair of panel members 3, 4 that are formed as flat plates, a solar cell assembly 10B sandwiched between the panel members 3, 4, transparent synthetic resin 6 charged between the panel members 3, 4, and a plurality of external leads 8p, 8n for outputting the electric output of a plurality of spherical solar cells 20 to the exterior. Up, down, left and right in FIG. 26 are explained as being up, down, left and right, and it is supposed that the front side of the drawing paper in FIG. 26 is the incident side of sunlight.

The pair of panel members 3, 4 are provided in parallel, in order to close both sides of a plurality of solar cell arrays 11B. The gap between the panel members 3, 4 is set by a plurality of lead pieces 16 and a plurality of intermediate lead pieces 17 that are sandwiched between the panel members 3, 4. The transparent synthetic resin 6 is charged between the panel members 3, 4 in order to seal the solar cell assembly 10B with resin, and at least the panel member 3 on the incident side of sunlight is made from a transparent material. A plurality of pairs of lead terminals 81a, 81b that will be described later are provided on the left and right side edge portions of the module 1.

Next, the solar cell group 10B will be explained.
As shown in FIGS. 28 to 32, the cell assembly 10B comprises: a plurality of spherical solar cells 20 that are endowed with the function of photoelectric conversion, and that are arranged in the matrix form having a plurality of rows and a plurality of columns, with their directions of electrical conductivity being aligned along the column direction of the matrix; a plurality of bypass diodes 40 arranged in a plurality of columns at both end portions of rows of the matrix and at intermediate portions thereof and an electrically conductive connecting mechanism 13B in which the plurality of spherical solar cells 20 in each row are connected in parallel. At least one column of bypass diodes 40 may be provided.

Each of the plurality of solar cell arrays 11B that make up the cell assembly 10B comprises a plurality of spherical solar cells 20 and plural bypass diodes 40 for that row, and the plurality of solar cell arrays 11B are sandwiched between a pair of lead members 14B, 14B. The electrically conductive directions of all of the pluralities of spherical solar cells 20 for the plurality of rows are all aligned in the same direction (i.e. column direction). The cell assembly 10B is made by laminating a plurality of spacers 85 made from insulating material between solar cell arrays 11B that are adjacent in the column direction of the matrix. The spherical solar cells 20 are similar to the solar cells 20 of Embodiment #1 described above. It should be understood that it is not necessary to provide a plurality of the spacers 85 for each row; it would also be acceptable to provide only one.

Next, the electrically conductive connecting mechanism 13B will be explained. This electrically conductive connecting mechanism 13B is a mechanism that connects in parallel the plurality of cells 20 and the plurality of bypass diodes 40 in each row via a pair of lead members 14B, 14B; the lead members 14B comprise a plurality of lead strings 15, a plurality of lead pieces 16, and one or plural intermediate lead pieces 17, and are similar to the lead members 14 of Embodiment #1. However, lead terminals 81a, 81b (external leads) are provided to the lead pieces 16, extending to the exterior in the row direction. It would be acceptable to form a lead terminal 81a or a lead terminal 81b integrally at least at the one end portions of the lead members 14B. The connection mechanism between the plurality of solar cells 20, the plurality of bypass diodes 40, and the pair of lead members 14b for each row is the same as the electrically conductive connecting mechanism 13 of Embodiment #1, and accordingly explanation thereof is omitted.

Figure 33:
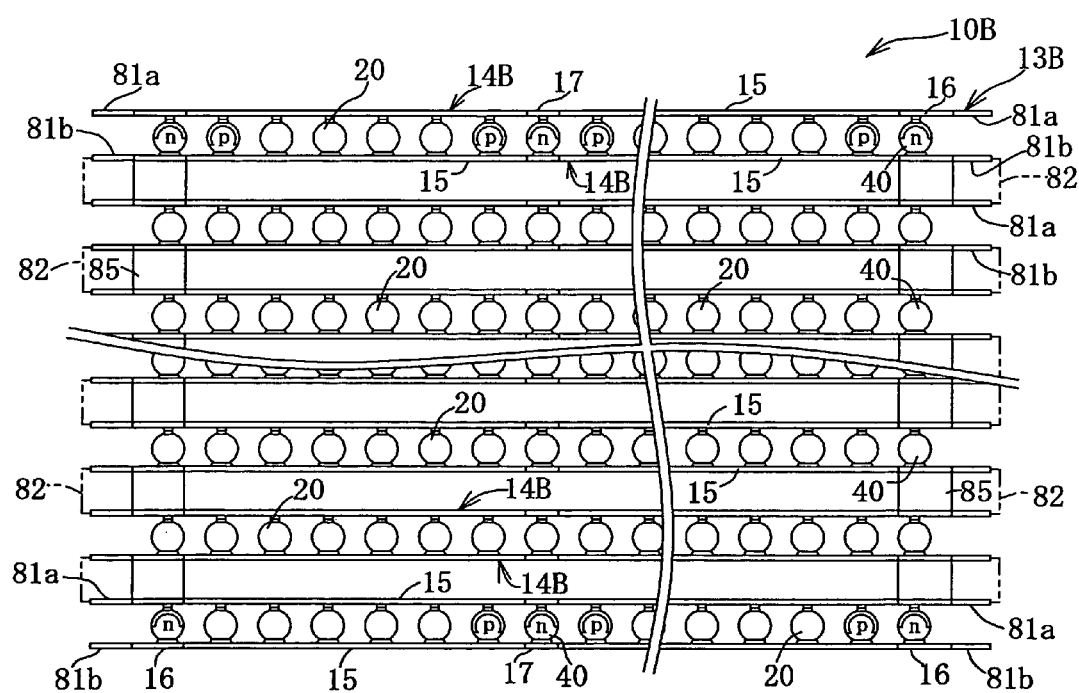
FIG. 33 is an elevation view of the solar cell assembly in a state in which a plurality of solar cell arrays are connected in series.
Figure 34:
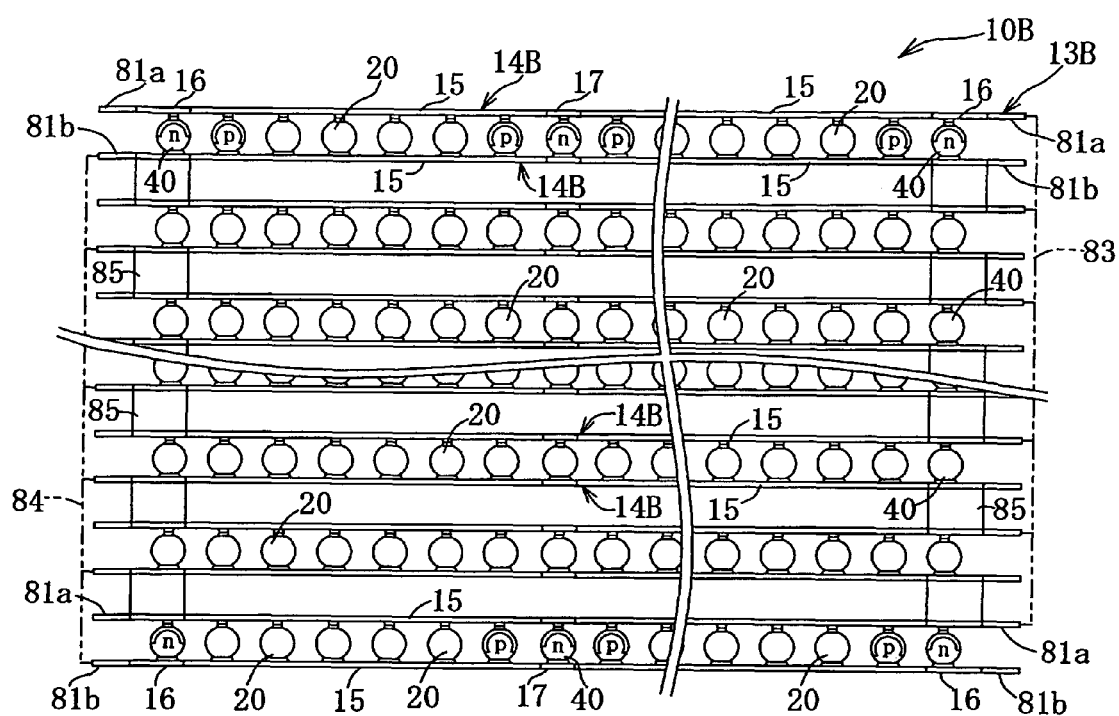
FIG. 34 is an elevation view of the solar cell assembly in a state in which a plurality of solar cell arrays are connected in parallel.

Next, the operation of this solar cell module 1B and the advantages thereof will be explained. With this solar cell module 1B, the output characteristics of the module can be varied as appropriate by altering the connection mechanism of the plurality of lead terminals 81a, 81b by changing over external switches. If the maximum output voltage is to be extracted from the solar cell module 1B, then, as shown in FIG. 33, the arrays 11B in the plurality of rows may be connected in series via external leads 82. On the other hand, if the maximum output current is to be extracted, then, as shown in FIG. 34, the arrays 11B in the plurality of rows may be connected in parallel via external leads 83 and 84.

While, in the examples described above, examples were explained in which the plurality of solar cell arrays 11B were connected in series or were connected in parallel, it would also be possible to set the number of the solar cell arrays 11B that are connected in series appropriately in order to match the desired output voltage, and to set the number of the solar cell arrays 11B that are connected in parallel appropriately in order to match the desired output current. Explanation of other features of the operation of this embodiment and of other benefits thereof will be omitted, since they are generally the same as those of Embodiment #1.

Figure 35:
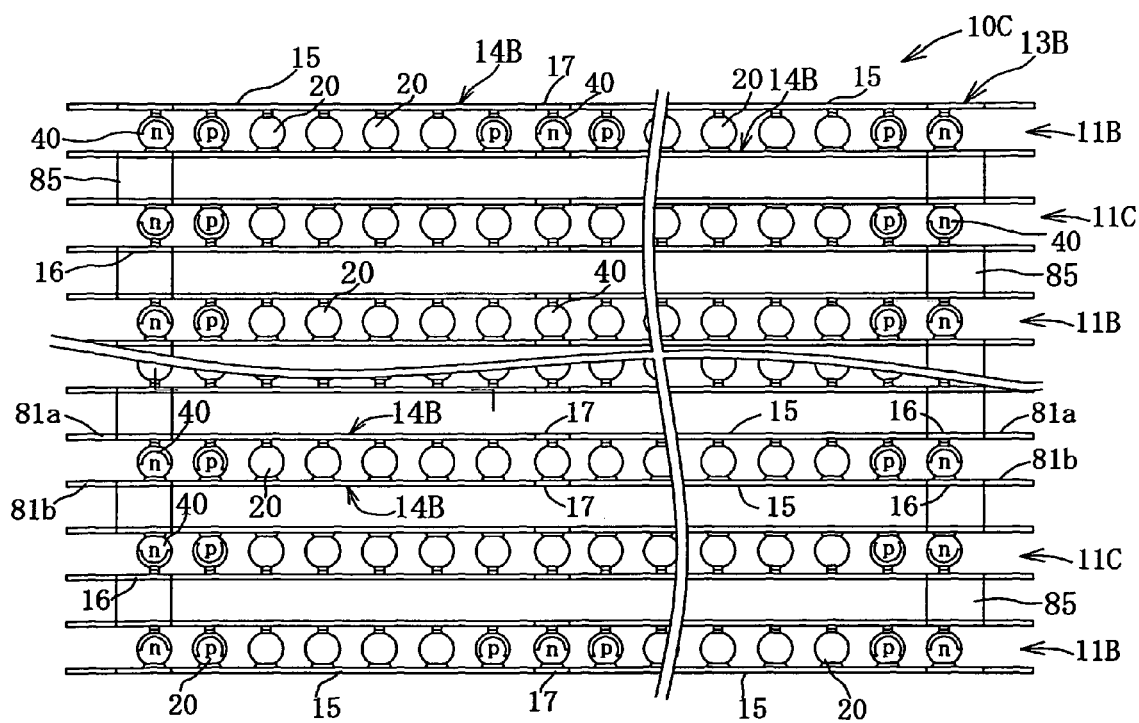
FIG. 35 is an elevation view of a solar cell assembly in which the solar cell group according to the third embodiment has been partially modified.

It would also be possible to apply the following variant embodiments to the solar cell assembly 10B described above.
As shown in FIG. 35, in a solar cell assembly 10C, the solar cell arrays 11B and solar cell arrays 11C, in which the electrically conductive directions of the spherical solar cells 20 and the bypass diodes 40 of the solar cell arrays 11B are inverted, are arranged alternately with a plurality of spacers 85 made from insulating material being sandwiched between them. Since the arrays 11B, 11C are independent, it is thus possible to employ a configuration in which the plurality of arrays 11B are inverted, as described above, in consideration of convenience in wiring the lead terminals 81a, 81b. to the exterior. It is also possible to set the gaps between the arrays 11B, 11C freely, by varying the sizes of the spacers 85 and/or by omitting the spacers 85.

Now, examples in which these embodiments are partially modified will be explained.

[1] The ratio of lighting versus output electrical power provided by these modules 1, 1A, and 1B principally depends on the output electrical power of the plurality of solar cells 20 that are employed, versus the total area shielded from light by the solar cells 20, the bypass diodes 40, and the electrically conductive connecting mechanism 13. It is possible, by varying the gaps between the solar cells and between the solar cell arrays for this reason, appropriately to design the arrangement of the plurality of spherical solar cells 20 that are used and the number thereof that are used, and the shape and so on of the electrically conductive connecting mechanism 13, in order to increase the freedom of design and to enhance the added value during use as a window material.

[2] It would also be possible to use spherical solar cells and bypass diodes in which the n type layers and the p type layers of the spherical solar cells 20 and the bypass diodes 40 of the above modules 1, 1A, and 1B are inverted. In this case, the output of the module would be reversed.

[3] Apart from the above, for a person skilled in the art, it would be possible to implement alterations to the above embodiments in various other ways, provided that the distinguishing characteristics of the present invention are not deviated from; so that the present invention is to be understood as also including those variant embodiments.

INDUSTRIAL APPLICABILITY

In addition to the above described solar cell panels or modules, the solar cell module of the present invention could also be applied to various structural materials such as, for example, a window material, a glass window, an atrium, a top light, a curtain wall, a facade, a canopy, a louver, a double skin outer surface, a guard rail of a balcony, or a soundproofing wall of a high speed road or a railroad or the like.

The invention claimed is:

1. A solar cell module comprising a plurality of solar cells, each of the solar cells comprising a spherical semiconductor element, the solar cells being arranged so as to form a matrix of the spherical semiconductor elements, the matrix having a plurality of rows and a plurality of columns; each spherical semiconductor element comprising a p type or n type spherical semiconductor and a pn junction having a shape of a partial sphere on an outer surface of said spherical semiconductor; a plurality of conductive directions of said spherical semiconductor elements being directed in a direction parallel to a column direction of said matrix; a plurality of spherical semiconductor elements in each said row being electrically connected in parallel and a plurality of spherical semiconductor elements in each said column being electrically connected in series;

wherein the solar cells comprise a plurality of solar cell arrays and each of the solar cell arrays is comprised of a respective one of said rows of spherical semiconductor elements, a pair of lead members and a plurality of bypass diodes, said pair of lead members connecting the spherical semiconductor elements of said respective row to said plurality of bypass diodes in reverse parallel;

wherein respective said lead members are positioned between adjacent rows of said plurality of rows so as to be shared by the solar cell arrays comprising said adjacent rows;

wherein each of said lead members comprises a plurality of lead pieces formed on at least two end portions of said lead member and extending from the lead member in a lengthwise direction of the lead member, each lead piece having a length in said lengthwise direction which is larger than a diameter of said spherical semiconductor elements and larger than a dimension in said lengthwise direction of said bypass diodes; and the lead pieces extending from the lead members in a lengthwise direction of the lead members;

wherein a pair of panel members are disposed in parallel each on a respective side of said plurality of solar arrays;

wherein said lead pieces are disposed between the panel members of said pair of panel members orthogonally to said panel members; and wherein distance between the panel members of said pair of panel members is the same as a dimension of said lead pieces orthogonal to said lengthwise direction.

2. The solar cell module according to claim 1, wherein said plurality of solar cell arrays are made in a form of a flat plate;

wherein a pair of parallel panel members are provided so as to close each of two sides of the plurality of solar cell arrays;

wherein transparent synthetic resin is disposed between said pair of panel members so as to seal the plurality of spherical semiconductor elements and the plurality of lead members; and wherein at least the panel member on an incident side of sunlight is made from a transparent material.

3. The solar cell module according to claim 2, wherein a reflective layer or a printed layer that has been ornamented is formed on an inner surface or outer surface of the panel member, among said pair of panel members, that is on a side opposite to the incident side of sunlight.

4. The solar cell module according to claim 1, wherein said plurality of solar cell arrays are made in a shape of plural partially cylindrical surfaces connected at one or plural inflection points dividing equally along rows of the matrix form, or in a shape of a single partially cylindrical surface; and wherein there are a first curved panel member, made from a transparent material, that closes a surface of the plurality of solar cell arrays on an incident side of sunlight and has a shape of said one or plural partially cylindrical surfaces, a second curved panel member that closes a surface of the plurality of solar cell arrays on an opposite side to the incident side of sunlight and has a shape of said one or plural partially cylindrical surfaces, and transparent synthetic resin disposed between said first and second curved panel members for sealing the plurality of spherical semiconductor elements and the plurality of lead members.

5. The solar cell module according to claim 1, wherein one or plural intermediate lead pieces similar to said lead piece at two end portions of the lead member, are formed integrally with one or plural intermediate portions of said lead members in the row direction of the matrix form, and wherein one or plural bypass diodes are provided corresponding to said one or plural intermediate lead pieces in each row.

6. The solar cell module according to claim 1, wherein engagement portions for engaging with external guide members during assembly of the solar cell module are formed at the outer end portions of each of said lead pieces.

* * * * *